United States Patent
Ichikawa et al.

(10) Patent No.: US 7,471,819 B2
(45) Date of Patent: Dec. 30, 2008

(54) POSITION DETECTING APPARATUS, A POSITION DETECTING METHOD AND AN ELECTRONIC COMPONENT CARRYING APPARATUS

(75) Inventors: Masayoshi Ichikawa, Tokyo (JP); Aritomo Kikuchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 609 days.

(21) Appl. No.: 11/134,229

(22) Filed: May 20, 2005

(65) Prior Publication Data

US 2005/0249397 A1 Nov. 10, 2005

Related U.S. Application Data

(63) Continuation of application No. PCT/JP03/14962, filed on Nov. 25, 2003.

(30) Foreign Application Priority Data

Nov. 28, 2002 (JP) ............................. 2002-346558

(51) Int. Cl.
*G06K 9/00* (2006.01)
(52) U.S. Cl. ...................................... 382/145; 382/150
(58) Field of Classification Search .......... 382/141–151
See application file for complete search history.

(56) References Cited

U.S. PATENT DOCUMENTS

| | | | | |
|---|---|---|---|---|
| 5,108,024 A | * | 4/1992 | Kazem-Goudarzi et al. | 228/104 |
| 5,245,671 A | * | 9/1993 | Kobayashi et al. | 382/150 |
| 5,574,801 A | * | 11/1996 | Collet-Beillon | 382/150 |
| 5,592,562 A | * | 1/1997 | Rooks | 382/150 |
| 5,828,449 A | * | 10/1998 | King et al. | 356/237.1 |
| 6,236,747 B1 | * | 5/2001 | King et al. | 382/149 |
| 6,657,656 B1 | * | 12/2003 | Ueda et al. | 348/87 |
| 7,027,637 B2 | * | 4/2006 | Fang et al. | 382/145 |
| 2001/0040217 A1 | * | 11/2001 | Mizuoka et al. | 250/358.1 |

FOREIGN PATENT DOCUMENTS

| | | |
|---|---|---|
| JP | 4-152699 | 5/1992 |
| JP | 5-332740 | 12/1993 |
| JP | 6-58729 | 3/1994 |
| JP | 8-210820 | 8/1996 |
| JP | 10-123207 | 5/1998 |

(Continued)

OTHER PUBLICATIONS

Patent Abstracts of Japan, Publication No. 2000-011173 dated Jan. 14, 2000, 1 page.

(Continued)

*Primary Examiner*—Jingge Wu
*Assistant Examiner*—Jayesh A Patel
(74) *Attorney, Agent, or Firm*—Osha • Liang LLP

(57) ABSTRACT

A position detecting apparatus for detecting a position of an electronic component, which includes a terminal, includes an image acquiring unit for acquiring an image of the terminal, a terminal area detecting unit for detecting an area of the terminal from the image acquired by the image acquiring unit and an electronic component position detecting unit for detecting a position of the electronic component based on the area of the terminal detected by the terminal area detecting unit and predetermined terminal information of the electronic component.

16 Claims, 24 Drawing Sheets

FOREIGN PATENT DOCUMENTS

| | | |
|---|---|---|
| JP | 11-353480 | 12/1999 |
| JP | 2000-11173 | 1/2000 |
| WO | WO 0227267 A1 * | 4/2002 |
| WO | WO 0227267 A1 * | 4/2002 |

OTHER PUBLICATIONS

Patent Abstracts of Japan, Publication No. 05-332740 dated Dec. 14, 1993, 1 page.
Patent Abstracts of Japan, Publication No. 11-353480 dated Dec. 24, 1999, 1 page.
Patent Abstracts of Japan, Publication No. 04-152699 dated May 26, 1992, 1 page.
Patent Abstracts of Japan, Publication No. 06-058729 dated Mar. 4, 1994, 1 page.
Patent Abstracts of Japan, Publication No. 08-210820 dated Aug. 20, 1996, 1 page.
Patent Abstracts of Japan, Publication No. 10-123207 dated May 15, 1998, 1 page.
International Search Report issued in PCT/JP03/14962 mailed Mar. 9, 2004; 3 pages.

* cited by examiner

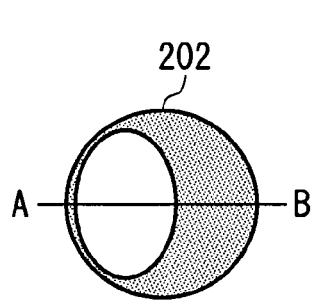
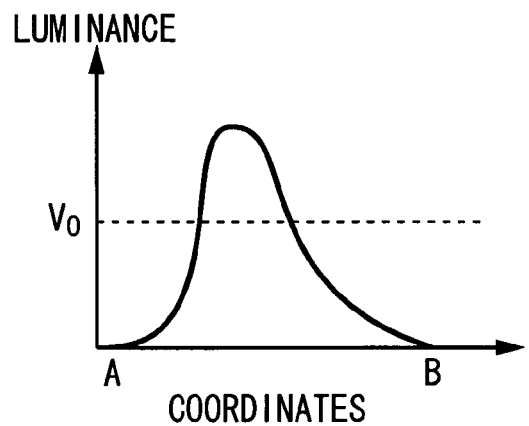
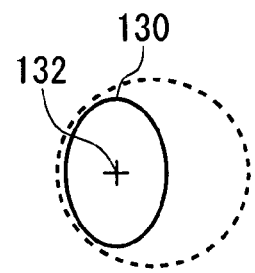
FIG. 6A               FIG. 6B               FIG. 6C
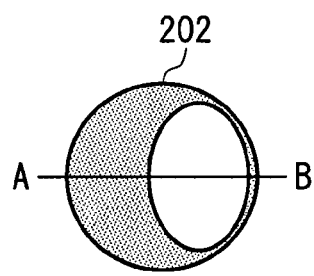
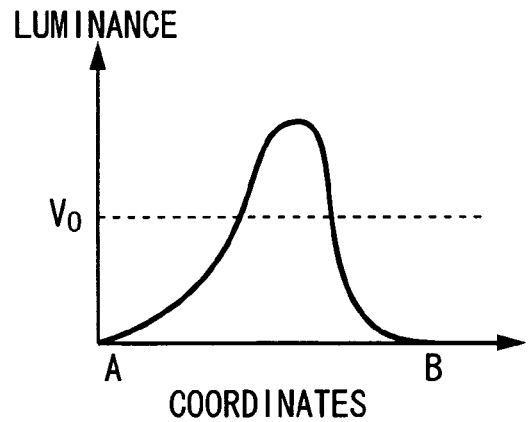
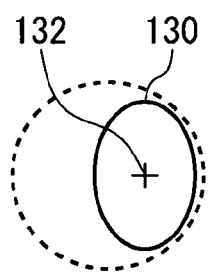
FIG. 6D               FIG. 6E               FIG. 6F

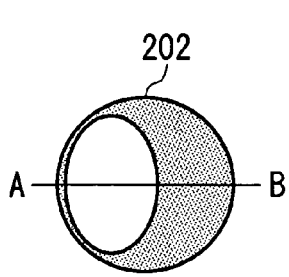
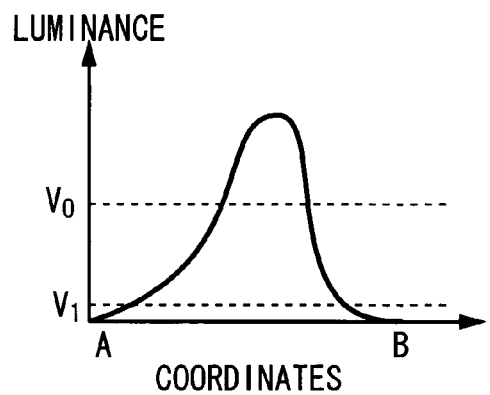
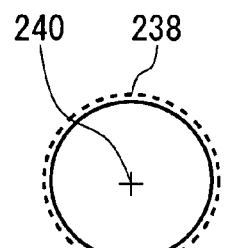
FIG. 16A      FIG. 16B      FIG. 16C
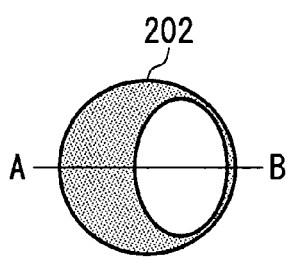
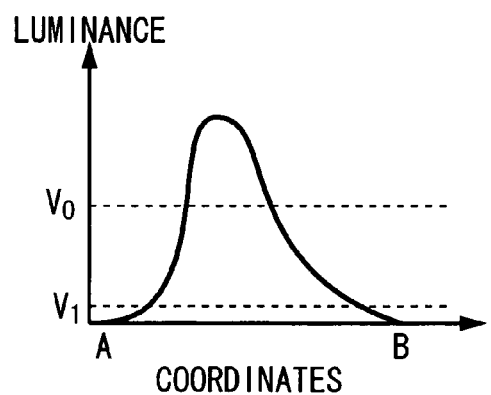
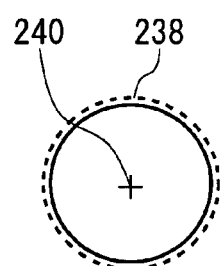
FIG. 16D      FIG. 16E      FIG. 16F

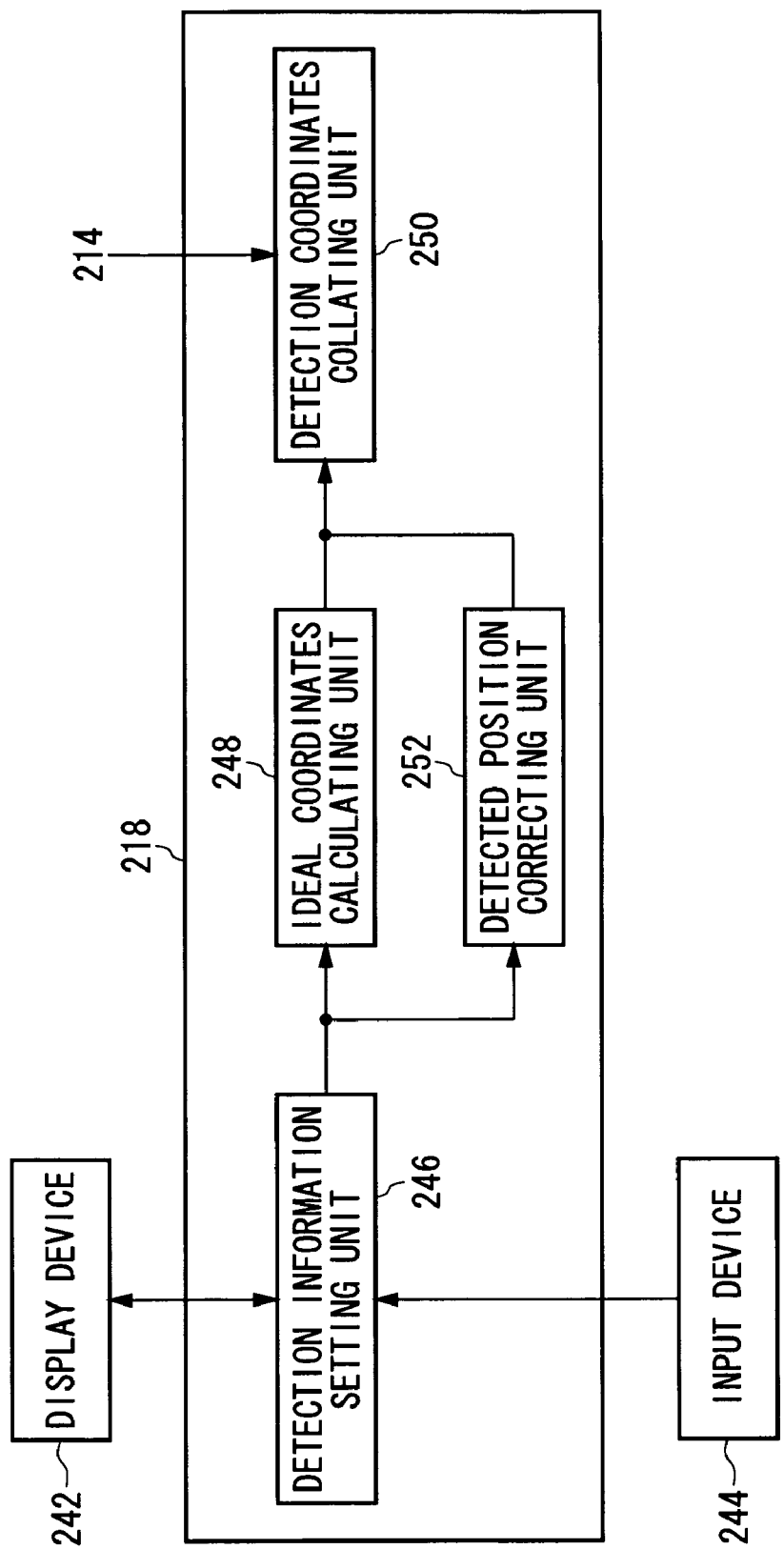

DETECTION
COORDINATES DATA

COLLATION RESULT

IDEAL
COORDINATES DATA

POSITION DETECTING APPARATUS, A POSITION DETECTING METHOD AND AN ELECTRONIC COMPONENT CARRYING APPARATUS

This patent application is a continuation application of PCT/JP03/14962 filed on Nov. 25, 2003 which claims priority from a Japanese patent application No. 2002-346558 filed on Nov. 28 2002, the contents of which are incorporated herein by reference.

BACKGROUND OF THE INVENTION

1. Field of the Invention

The present invention relates to a position detecting apparatus, a position detecting method and an electronic component carrying apparatus. More particularly, the present invention relates to a position detecting apparatus, a position detecting method and an electronic component carrying apparatus, which acquire the image of a terminal of an electronic component and detect the position of the electronic component by image processing.

2. Description of the Related Art

FIG. 1 shows the configuration of a conventional testing system 100. The testing system 100 includes a testing apparatus 102 for judging the quality of an electronic component 101 by applying test signals to the electronic component 101, a socket 103 for fixing the electronic component 101, a test head 104 for connecting the electronic component 101 fixed to the socket 103 and the testing apparatus 102 electrically and an electronic component carrying apparatus 106 for carrying the electronic component 101. The electronic component carrying apparatus 106 includes a tray 108 for holding the electronic component 101 to be tested and a carrying unit 110 for carrying the electronic component 101 between the tray 108 and the socket 103. The electronic component carrying apparatus 106 takes out the electronic component 101 from the tray 108, at which the electronic component 101 is arranged, carries it to the socket 103 and mounts it on to the socket 103. In addition, the electronic component carrying apparatus 106 removes the electronic component 101 tested from the socket 103 and carries it to the tray 108 classified corresponding to the test results.

FIGS. 2A and 2B show a state in which a terminal 112 of the electronic component 101 and a pin 114 of the socket 103 are in contact with each other. In order to test the electronic component having a plurality of terminals accurately, it is necessary to mount the electronic component 101 onto the socket 103 exactly. That is, as shown in FIG. 2A, it is preferable that the pin 114 of the socket 103 is in contact with a center of the terminal 112 of the electronic component 101 vertically. As shown in FIG. 2B, if the pin 114 of the socket 103 is in contact with the terminal 112 of the electronic component 101 deviating from the center of the terminal 112 or in contact with the terminal 112 of the electronic component 101 on a slant, the electrical resistance increases at the contact point, problems such as deterioration of waveforms of test signals, increase of the timing error and the like occur. In addition, if the electronic component 101 is fixed to the socket 103 in the state in which the pin 114 of the socket 103 deviates from the terminal 112 of the electronic component 101, the electronic component 101 might be broken as well.

FIG. 3 shows the configuration of the carrier 116. In the electronic component carrying apparatus 106, the electronic component 101 is positioned to the socket 103 by using the carrier 116. The carrier 116, which is a case for containing the electronic component 101, is formed by molding of, e.g., plastic. In the carrier 116, a concave part 118 of a rectangle shape is formed, so that the electronic component 101 is contained and fixed into the concave part 118. In addition, a hole 120 is provided on a lower surface of the carrier 116, and thus the terminal 112 of the electronic component 101 is coupled to the pin 114 the socket 103 electrically via the hole 120. The concave part 118 has the same shape as the electronic component 101, so that the electronic component 101 can be contained in the concave part 118 without a gap. Accordingly, when the electronic component 101 is positioned by using the carrier 116, a carrier 118 that fits with every shape of the electronic component 101 is needed.

However, these days, the kind of the electronic component 101 varies and the shape and size of it become various. Therefore, according to the shapes of the electronic component, it is inevitable to produce and purchase various kinds of the carrier 116, and thus the cost of production is increased. In addition, the design and production of the carrier 118 that fits with the shape of the electronic component 101 takes time, so that the launch of the production has to be postponed.

In addition, recently, the electronic components used for mobile communication devices such as a mobile phone becomes small in size and thin in thickness, and the number of the terminals are extremely increasing as the electronic component becomes highly integrated and multi-functional. Accordingly, the terminal of the electronic component becomes miniaturized and the pitch becomes shortened in regard to the arrangement interval. For example, if the terminal of the electronic component is a solder ball, the diameter of the solder ball becomes small up to 0.3 mm and the arrangement interval becomes up to 0.4 mm. In this way, if the terminal of the electronic component becomes miniaturized and the pitch becomes shortened in regard to the arrangement interval, there is a problem that it is impossible to position the terminal 112 of the electronic component 101 and the pin 114 of the socket 103 with high accuracy in a method of positioning the electronic component 101 by using the carrier 116 as shown in FIG. 3.

In order to solve the problem, an electronic component carrying apparatus (cf. Japanese Patent Application Publication No. 1993-275518) for positioning the electronic component 101 to the socket 103 is suggested, wherein it picks up the image of the terminal 112 of the electronic component 101 by a CCD camera and measures the position of the terminal 112 of the electronic component 101 by using an image processing method.

However, if light is applied to the electronic component 101 in a vertical direction, a substrate, on which the terminal 112 is formed, is liable to reflect the light, so that there is a problem that the difference of brightness between the terminal part and the substrate part becomes small and an clear image of the terminal 112 cannot obtained, and accordingly it is impossible to detect the position of the terminal 112 accurately.

SUMMARY OF THE INVENTION

Therefore, it is an object of the present invention to provide a position detecting apparatus, a position detecting method and an electronic component carrying apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a position detecting apparatus for detecting a position of an electronic component, which includes a terminal, includes an image acquiring unit for acquiring an image of the terminal, a terminal area detecting unit for detecting an area of the terminal from the image acquired by the image acquiring unit and an electronic component position detecting unit for detecting a position of the electronic component based on the area of the terminal detected by the terminal area detecting unit and predetermined terminal information of the electronic component.

The electronic component position detecting unit may detect a position of the terminal based on the area of the terminal detected by the terminal area detecting unit and calculates the position of the electronic component based on the position of the terminal detected and a position, which is the terminal information and the terminal is formed at in regard to the electronic component.

The position detecting apparatus may further include an edge extracting unit for extracting an edge area, which is an area of an edge of the terminal, from a multi-value image which is the image acquired by the image acquiring unit and a first threshold determining unit for determining a first threshold to be a pixel value at which a number of pixels is greatest among pixels of the edge area, wherein the terminal area detecting unit may detect the area of the terminal from the multi-value image based on the first threshold.

The position detecting apparatus may further include a light source for emitting light onto the terminal in a slating direction to the electronic component, wherein the image acquiring unit may detect the multi-value image of the terminal onto which light is emitted by the light source.

The image acquiring unit may detect the multi-value image of a plurality of the terminals of the electronic component, the edge extracting unit may extract a plurality of the edge areas of the plurality of terminals from the multi-value image, the first threshold determining unit may determine the first threshold to be a pixel value at which a number of pixels is greatest among pixels of the plurality of edge areas, the terminal area determining unit may detect areas of the plurality of terminals from the multi-value image based on the first threshold and the electronic component position detecting unit may detect the position of the electronic component based on the areas of the plurality of terminals.

The electronic component may include the terminal having a substantially spherical surface, and the image acquiring unit may acquire the multi-value image of the terminal having the substantially spherical surface onto which light is emitted by the light source.

The position detecting apparatus may further include a terminal binary value image generating unit for generating a binary value image from the multi-value image based on the first threshold; wherein the terminal area detecting unit may detect the area of the terminal from the multi-value image based on the binary value image generated by the terminal binary value image generating unit.

The edge extracting unit may further include an edge expected value storing unit for storing an edge expected value which is an expected value of a number of pixels of the edge area, a differentiated image generating unit for generating a differentiated image resulting from differentiating the multi-value image, a second threshold determining unit for adding a number of pixels in an order wherein a pixel value becomes greater in regard to the differentiated image and determining a second threshold to be a pixel value when the number of pixels added reaches the edge expected value and an edge area detecting unit for detecting the edge area from the multi-value image based on the second threshold.

The edge extracting unit may further include an edge binary value image generating unit for generating a binary value image from the differentiated image based on the second threshold, and the edge area detecting unit may detect the edge area from the multi-value image by multiplying a pixel value of a pixel wherein the binary value image generated by the edge binary value image generating unit and the multi-value image correspond.

The position detecting apparatus may further include a terminal expected value storing unit for storing a terminal expected value, which is an expected value of a number of pixels of the area of the terminal, wherein the first threshold determining unit may change the first threshold in case the number of pixels of the area of the terminal detected by the terminal area detecting unit is different from the terminal expected value by more than a predetermined value.

The position detecting apparatus may further include a display device for display an arrangement of a plurality of the terminals of the electronic component, an input device for allowing a user to select at least one of the plurality of terminals displayed by the display device and a weight determining unit for setting a weight of a position of the at least one, which is selected by the user with the input device, of the plurality of terminals to be greater than a weight of a position of the terminal not selected by the user, wherein the electronic component position detecting unit may detect the position of the electronic component based on the weight of each position of the terminal determined by the weight determining unit.

The input device may allow the user to select at least one of the plurality of terminals displayed by the display device for each magnitude of the weight of the position of the terminal, and the electronic component detecting unit may detect the position of the electronic component based on the weight of each position of the terminal selected for each weight of the position of the terminal.

The display device may display each terminal selected for each weight of the position of the terminal together with an image indicating the weight of the position of the terminal.

The weight determining unit may set a weight of a position of a terminal performing input or output of a first analog signal among the plurality of terminals to be greater than a weight of a position of a terminal performing input or output of a second analog signal.

The weight determining unit may determine weights of positions of the plurality of terminals based on a frequency of a signal which is supposed to be inputted or outputted through the plurality of terminals.

The weight determining unit may set a weight of a position of a terminal performing input or output of a signal of a first frequency greater than a predetermined frequency among the plurality of terminals to be greater than a weight of a position of a terminal performing input or output of a signal of a second frequency smaller than a predetermined frequency.

According to the second aspect of the present invention, a position detecting method for detecting a position of an electronic component, which includes a terminal, includes the steps of acquiring an image of the terminal, detecting an area of the terminal from the image acquired and detecting the position of the electronic component based on the area of the terminal detected.

According to the third aspect of the present invention, an electronic component carrying apparatus for carrying electronic component, which includes a terminal, to a desired position, includes a carrying unit for holding and carrying the electronic component, an image acquiring unit for acquiring an image of the terminal of the electronic component held by the carrying unit, a terminal area detecting unit for detecting an area of the terminal from the image acquired by the image acquiring unit and an electronic component position detecting unit for detecting a position of the electronic component corresponding to the carrying unit based on the area of the terminal detected by the terminal area detecting unit.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIGS. 6A through 6F show the strength distribution of the reflected light by a terminal 202.

FIGS. 16A through 16F show the strength distribution of the reflected light by a terminal 202.

FIG. 17 shows an example of the configuration of an electronic component position detecting unit 218.

FIG. 19 shows an example of terminal to be detected arrangement data.

FIGS. 21A and 21B show an example of a display screen of a display device 242.

FIG. 22 shows an example of reference terminal arrangement data.

FIGS. 24A and 24B show an example of a display screen of a display device 300.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
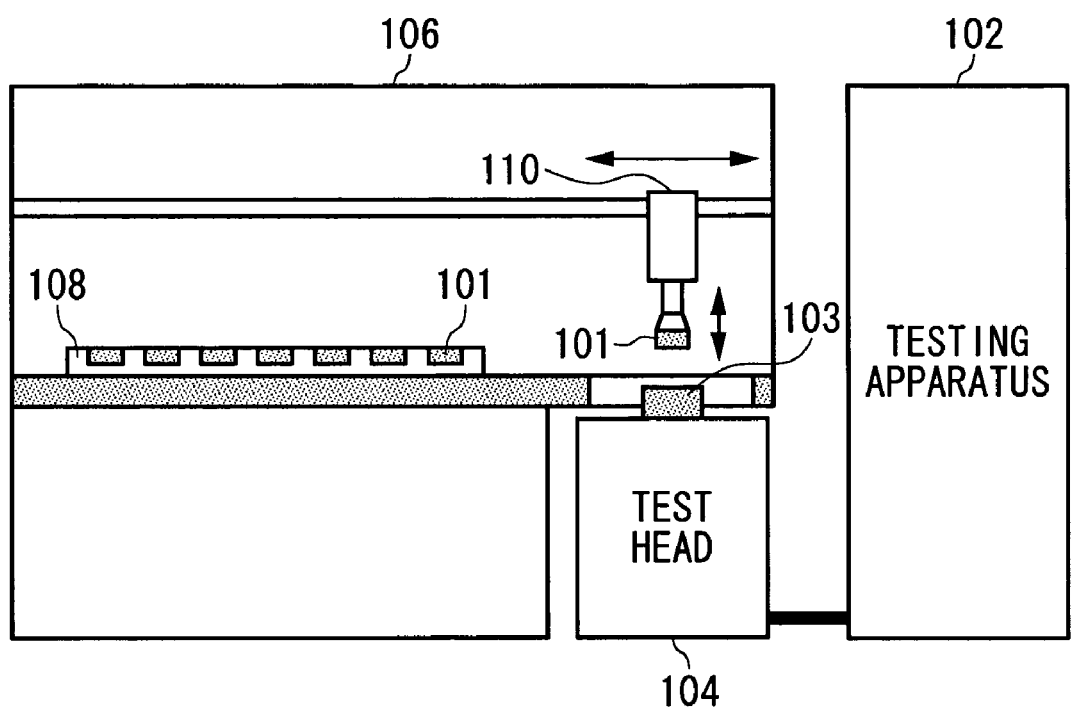
FIG. 1 shows the configuration of a conventional testing system 100.
Figure 2A:
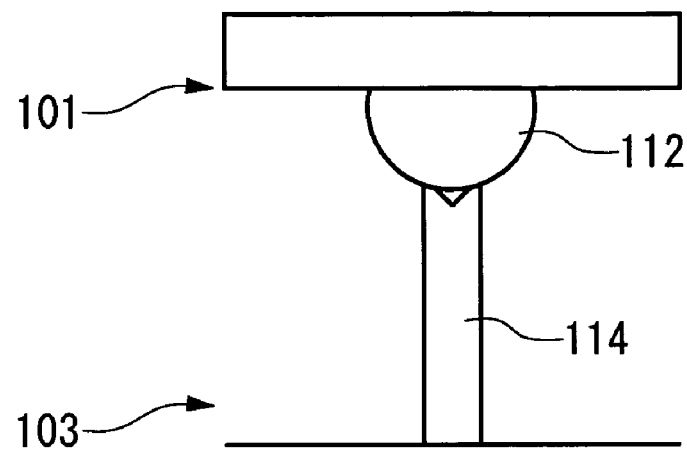
FIGS. 2A and 2B show a state in which a terminal 112 and a pin 114 are in contact with each other.
Figure 2B:
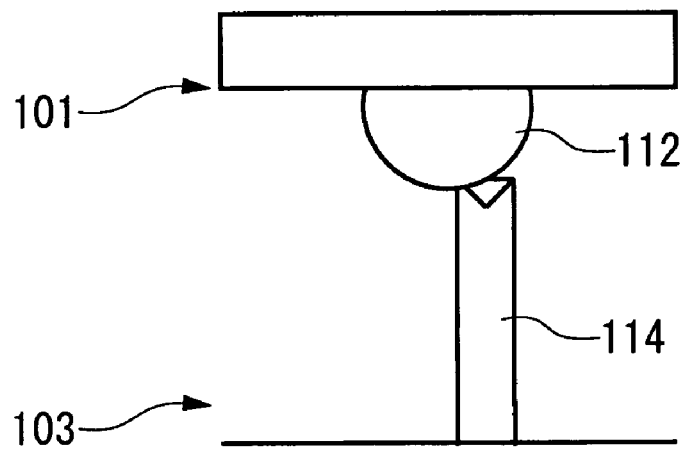
Figure 3:
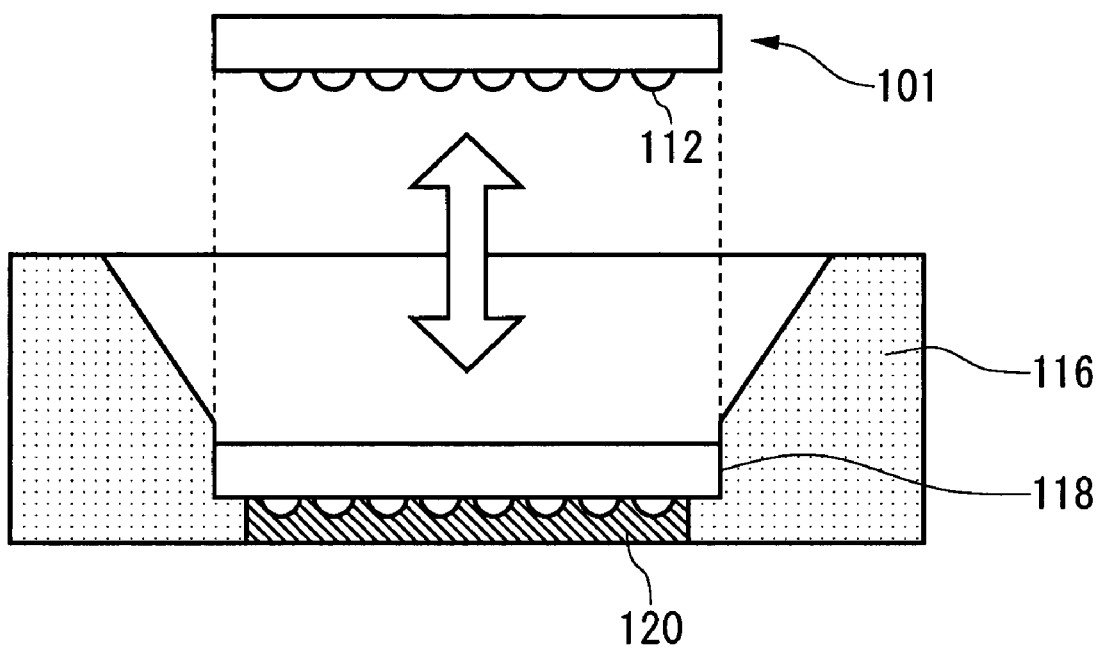
FIG. 3 shows the configuration of a carrier 116.
Figure 4:
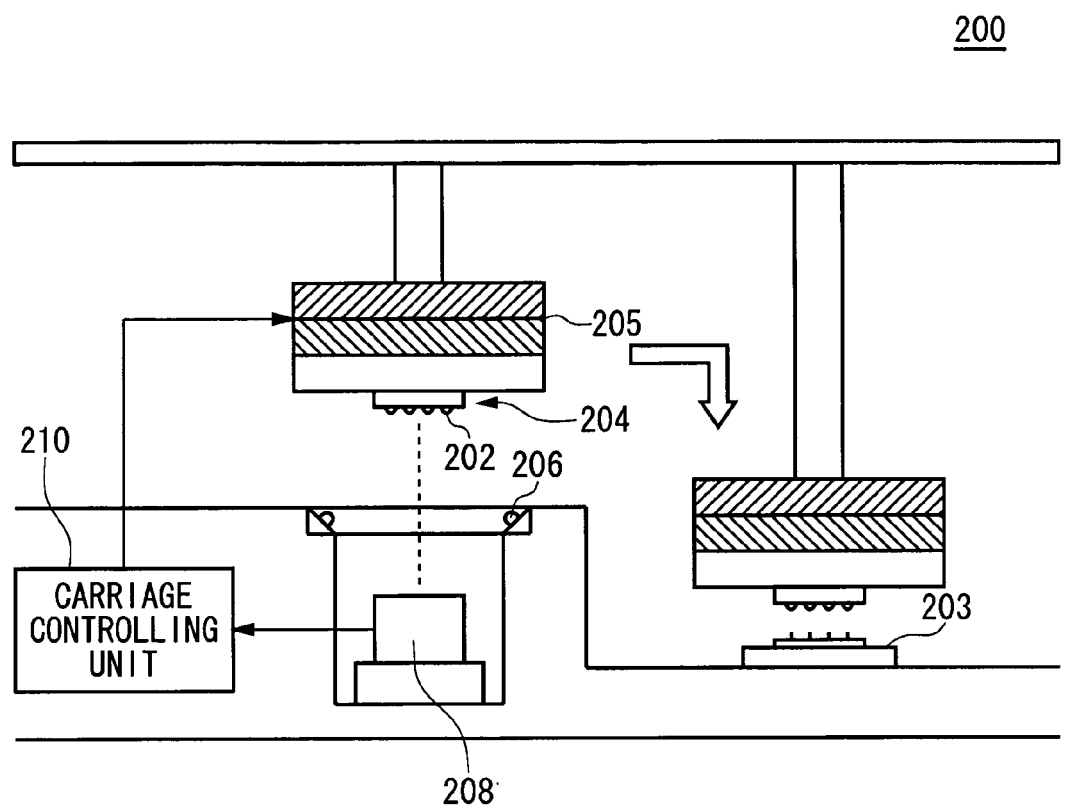
FIG. 4 shows an example of the configuration of an electronic component carrying apparatus 200.

FIG. 4 shows an example of the configuration of an electronic component carrying apparatus 200 according to an exemplary embodiment of the present invention. The electronic component carrying apparatus 200 includes a carrying unit 205 for holding and carrying an electronic component 204 having a plurality of terminals 202 to a socket 203, a light source 206 for giving out light onto a surface on which the terminals 202 of the electronic component 204 are provided, an imaging unit 208 for acquiring a multi-value image of the plurality of terminals 202 held by the carrying unit 205 and a carriage controlling unit 210 for detecting the position of the electronic component 204 to the carrying unit 205 based on the multi-value image acquired by the imaging unit 208 and controlling the carrying unit 205 based on the position of the electronic component 204.

The electronic component carrying apparatus 200 is an example of position detecting apparatus of the present invention. In addition, the electronic component carrying apparatus 200 is not only used for carrying the electronic component in regard to the testing system to test the electronic component, but may also be used for carrying the electronic component in regard to an electronic component mounting device for mounting the electronic component on a substrate or an apparatus for manufacturing a semiconductor device such as a wire bonding. In addition, the imaging unit 208, which is an example of the image acquiring unit of the present invention, picks up the image of an object while arranging a plurality of imaging elements such as a CCD (Charge Coupled Device) camera, a MOS (Metal Oxide Semiconductor) sense array.

The imaging unit 208 acquires the multi-value image of the plurality of terminals 202 exposed to the light given out by the light source 206. In addition, the electronic component 204 may include the terminals 202 of substantially spherical surfaces such as a solder ball. And, the imaging unit 208 may acquire the multi-value image of the terminals 202 of substantially spherical surfaces exposed to the light given out by the light source 206.

Figure 5:
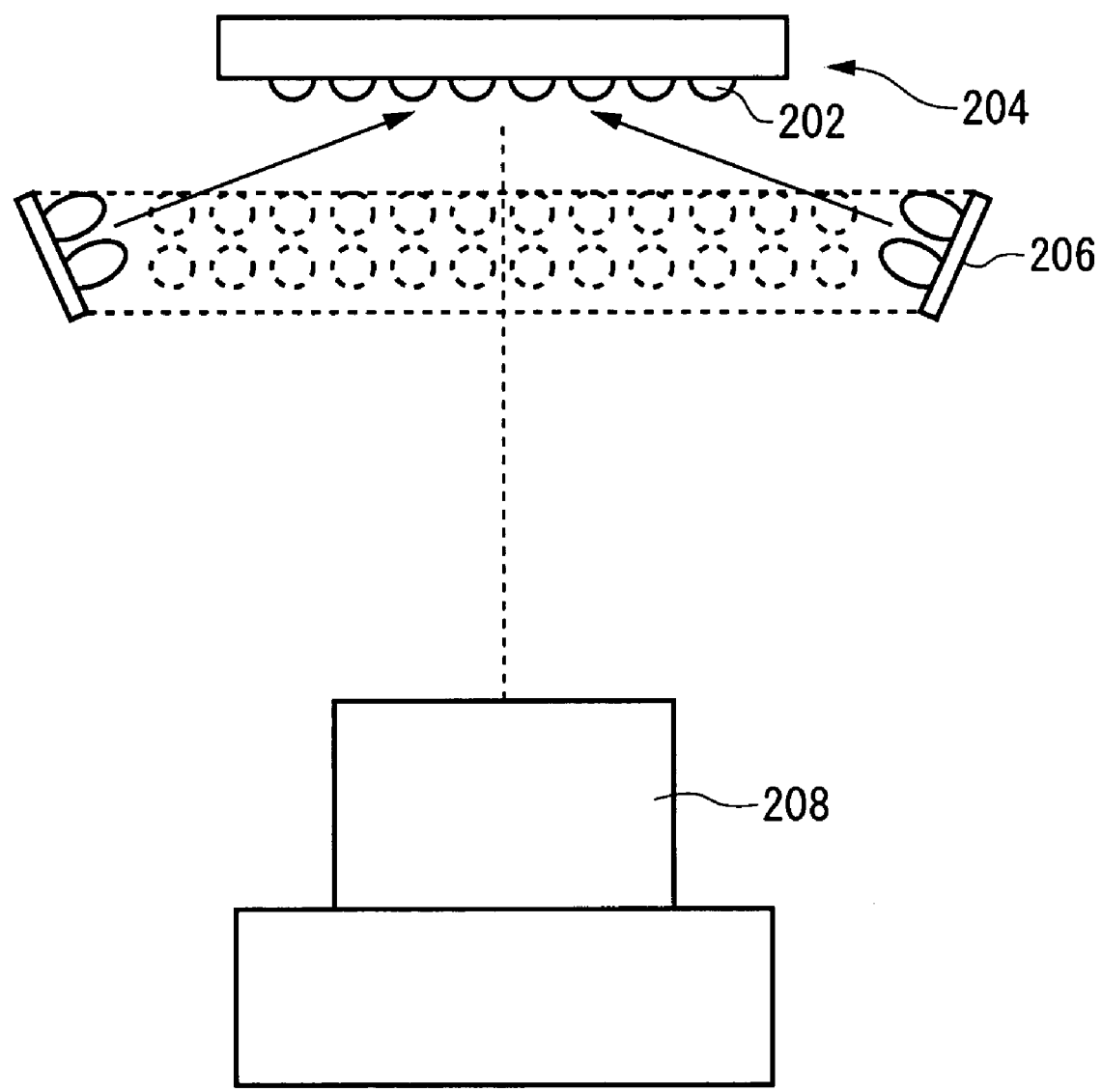
FIG. 5 shows the configuration of a light source 206.

FIG. 5 shows the configuration of a light source 206. The light source 206, which emits light onto the terminal 202 of the electronic component 204 in a slanting direction, is a rectangular shape having, e.g., circular or rectangular LED light sources at its four corner respectively. If the terminals 202 of the electronic component 204 are exposed to the light in a slanting direction, most of the light incident onto the substrate of the electronic component 204 is reflected out of the field of view of the imaging unit 208. In addition, most of the light incident onto side surfaces of the terminals 202 such as a solder ball is reflected into the field of view of the imaging unit 208. Therefore, by using the light source of emitting light obliquely, the difference of brightness between the substrate part and the terminal part of the electronic component 204 becomes greater, so that it is possible to detect the position of the terminal 202 accurately.

However, if the position of the electronic component 204 is detected by using the light source of emitting light obliquely, there is a problem below. Due to the position of the terminals 202 in regard to the electronic component 204, the distance from the terminals 202 to the left side of the light source 206 is different from the distance from the terminals 202 to the right side of the light source 206. Consequently, the center of the strength distribution of the reflected light from the front surface of the terminals 202 does not match the center of the terminal 202, so that it is impossible to detect the position of the terminal 202 accurately.

FIGS. 6A and 6B show the strength distribution of the reflected light from the terminal 202 positioned closer to the light source 206 of the left side than the light source 206 of the right side. FIG. 6C shows an area 130 of the terminal 202 detected by using a threshold process and center coordinates 132 calculated in case of setting the first threshold to be $V_0$ shown in FIG. 6B. In addition, FIGS. 6D and 6E show the strength distribution of the reflected light from the terminal 202 positioned closer to the light source 206 of the right side than the light source 206 of the left side. FIG. 6F shows an area 130 of the terminal 202 detected by using the threshold process and center coordinates 132 calculated in case of setting the first threshold to be $V_0$ shown in FIG. 6E. If the threshold is not set properly, the position of the terminal 202 detected by the threshold process has an error compared to the practical position of the terminal 202. Therefore, since it is impossible to calculate the center coordinates of the terminal 202 accurately due to the position of the terminal 202 in regard to the electronic component 204, there is a problem that the position of the electronic component 204 cannot be detected accurately.

Moreover, in the electronic components 204 developed recently, specific terminals 202 are applied with signals of extremely high speed, and it is also necessary to apply signals of extremely high speed to the specific terminals 202 in the test. Since the specific terminals 202 affects the performance of the electronic component 204 significantly, it is necessary to position them with high precision compared to other terminals 202. However, in the conventional method of positing the electronic component 204, since the position of the electronic component 204 is detected by the image process to all of the plurality of terminals 202 uniformly, the mounting error of the terminal 202 in regard to the electronic component 204, the detection error in regard to the image process and the like are balanced out, so that it is difficult to improve the precision in positioning the specific terminals 202.

Figure 7:
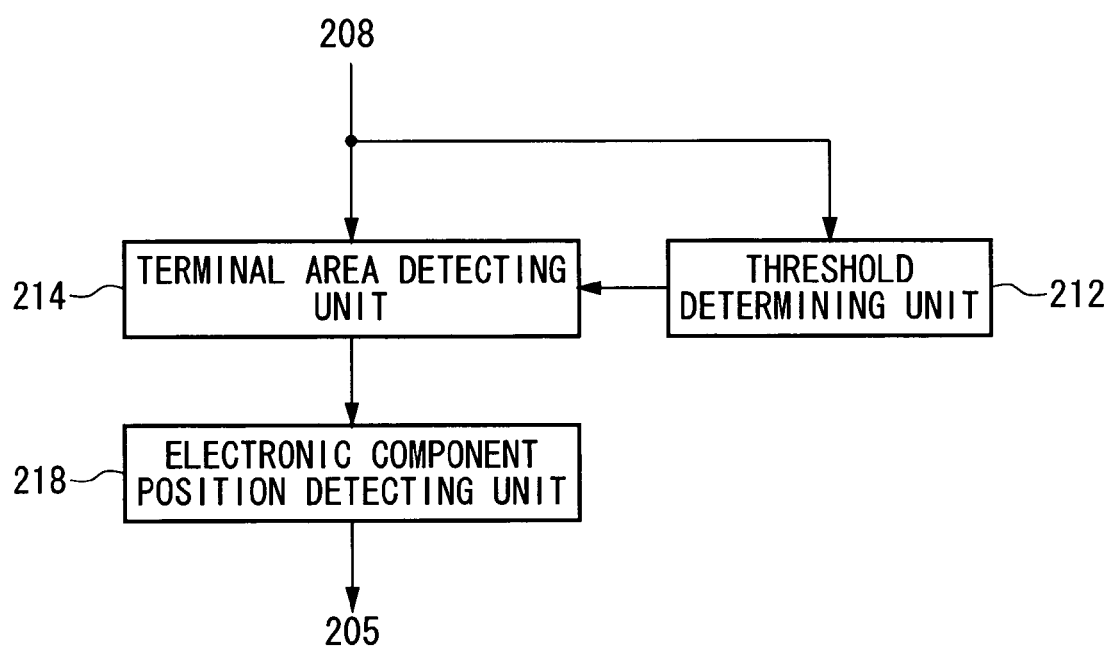
FIG. 7 shows an example of the configuration of a carriage controlling unit 210.

FIG. 7 shows an example of the configuration of a carriage controlling unit 210. The carriage controlling unit 210 includes a threshold determining unit 212 for determining a first threshold to extract areas of the terminals 202 from the multi-value image picked up by the imaging unit 208, a terminal area detecting unit 214 for detecting the areas of the plurality of terminals 202 from the multi-value image acquired by the imaging unit 208 based on the first threshold determined by the threshold determining unit 212 and an electronic component position detecting unit 218 for detecting the position of the electronic component 204 based on the areas of the plurality of terminals 202 detected by the terminal area detecting unit 214 and predetermined terminal information about the electronic component 204.

The electronic component position detecting unit 218 calculates pieces of detection coordinates data indicating the center coordinates of the plurality of terminals 202 respectively based on the areas of the plurality of terminals 202 detected by the terminal area detecting unit 214. The electronic component position detecting unit 218 performs collation on the detection coordinates data and the ideal coordinates data of the terminals 202 to detect the position at which the electronic component 204 exists. The carrying unit 205 carries the electronic component 204 based on the position of the electronic component 204 detected by the electronic component position detecting unit 218. It is an object of the carriage controlling unit 210 of the present invention to carry the electronic component 202 to the desired position in regard to the socket 203 in the carrying unit 205 by determining proper threshold with the threshold determining unit 212, detecting the areas of the terminals 202 of the electronic component 201 with high precision and calculating the position of the electronic component 201 accurately.

Figure 8:
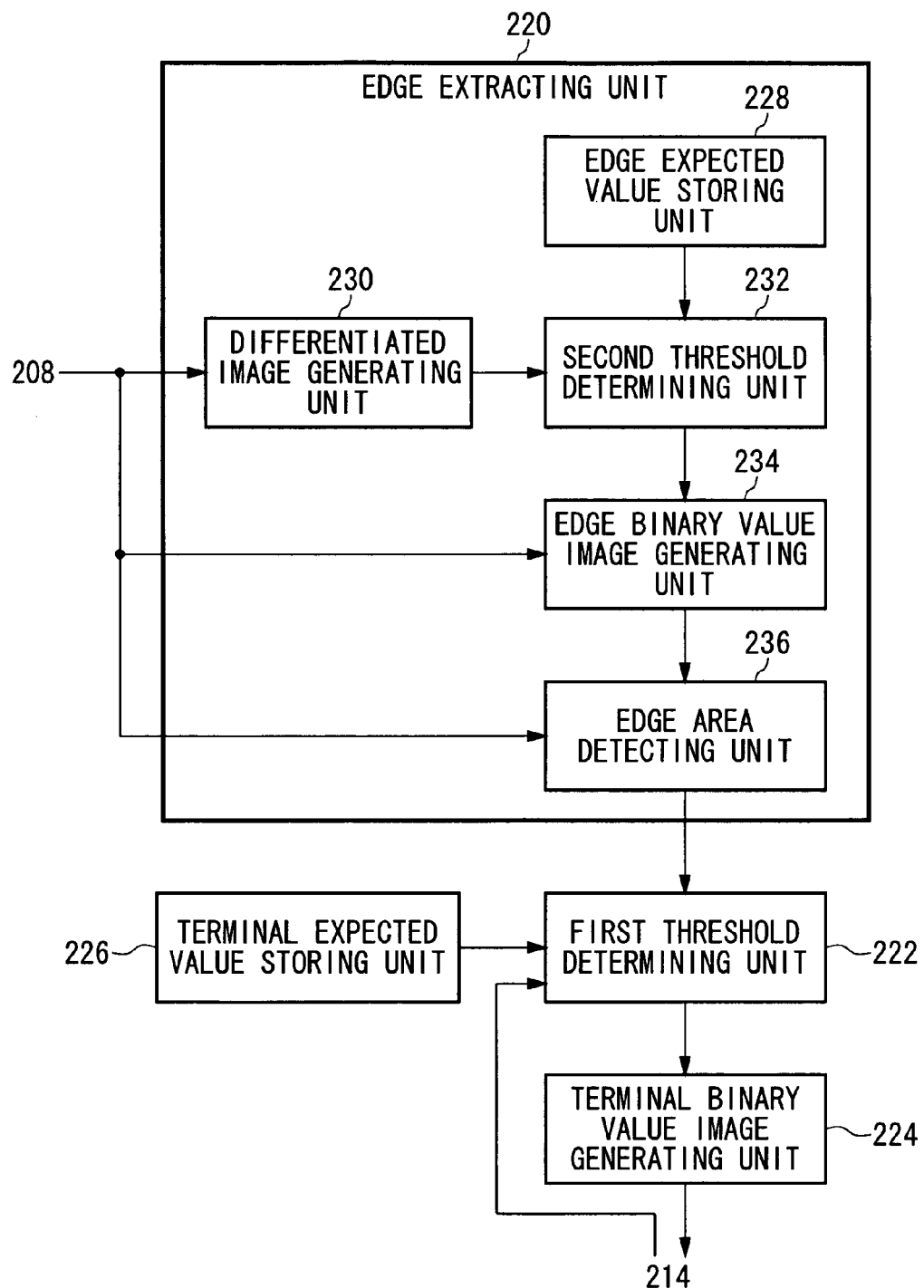
FIG. 8 shows an example of the configuration of a threshold determining unit 212.

FIG. 8 shows an example of the configuration of a threshold determining unit 212. The threshold determining unit 212 includes an edge extracting unit 220 for extracting a plurality of edge areas that areas of edges of the plurality of terminals 202 from the multi-value image acquired by the imaging unit 208, a first threshold determining unit 222 for determining the first threshold to be the pixel value wherein the number of pixels is greatest among the plurality of edge areas extracted by the edge extracting unit 220 and a terminal binary value image generating unit 224 for generating a binary value image from the multi-value image acquired by the imaging unit 208 based on the first threshold determined by the first threshold determining unit 222. The terminal area detecting unit 214 detects the areas of the plurality of terminals 202 from the multi-value image based on the binary value image generated by the terminal binary value image generating unit 224.

The threshold determining unit 212 further includes a terminal expected value storing unit 226 for storing a terminal expected value that is an expected value of the number of pixels of the areas of the terminals 202. And, the first threshold determining unit 222 changes the first threshold in case the number of pixels of the areas of the plurality of terminals 202 detected by the terminal area detecting unit 214 is different from the terminal expected value stored in the terminal expected value storing unit 226 by more than a predetermined value.

The edge extracting unit 220 includes an edge expected value storing unit 228 for storing an edge expected value indicating an expected value of the number of pixels of the edge area, a differentiated image generating unit 230 for generating a differentiated image by differentiating the multi-value image acquired by the imaging unit 208, a second threshold determining unit 232 for adding the number of pixels in an order wherein the pixel value becomes large in regard to the differentiated image generated by the differentiated image generating unit 230 and determining a second threshold to be a pixel value when the number of pixels added reaches the edge expected value stored in the edge expected value storing unit 228 and an edge binary value image generating unit 234 for generating a binary value image from the differentiated image based on the second threshold determined by the second threshold determining unit 232 and an edge area detecting unit 236 for detecting an edge area from the multi-value image by multiplying the pixel values of the pixels wherein the binary value image generated by the edge binary value image generating unit 234 and the multi-value image acquired by the imaging unit 208 correspond. The edge area detecting unit 236 may detect the edge area from the multi-value image acquired by the imaging unit 208 based on the second threshold determined by the second threshold determining unit 232 by a method except multiplying the pixel values of the pixels wherein the binary value image generated by the edge binary value image generating unit 234 and the multi-value image acquired by the imaging unit 208 correspond.

Figure 9:
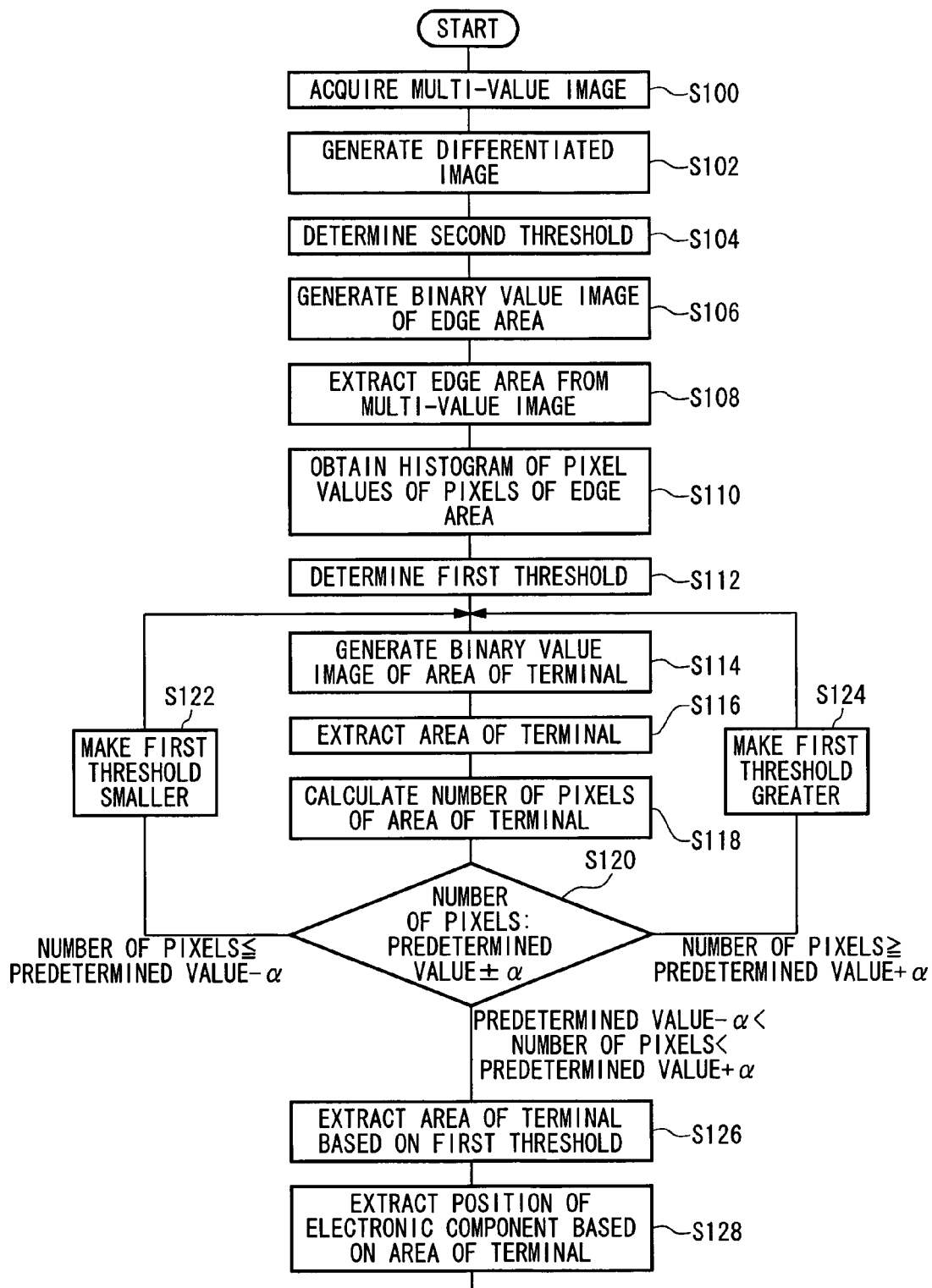
FIG. 9 shows an example of a position detecting method for an electronic component 204.
Figure 10:
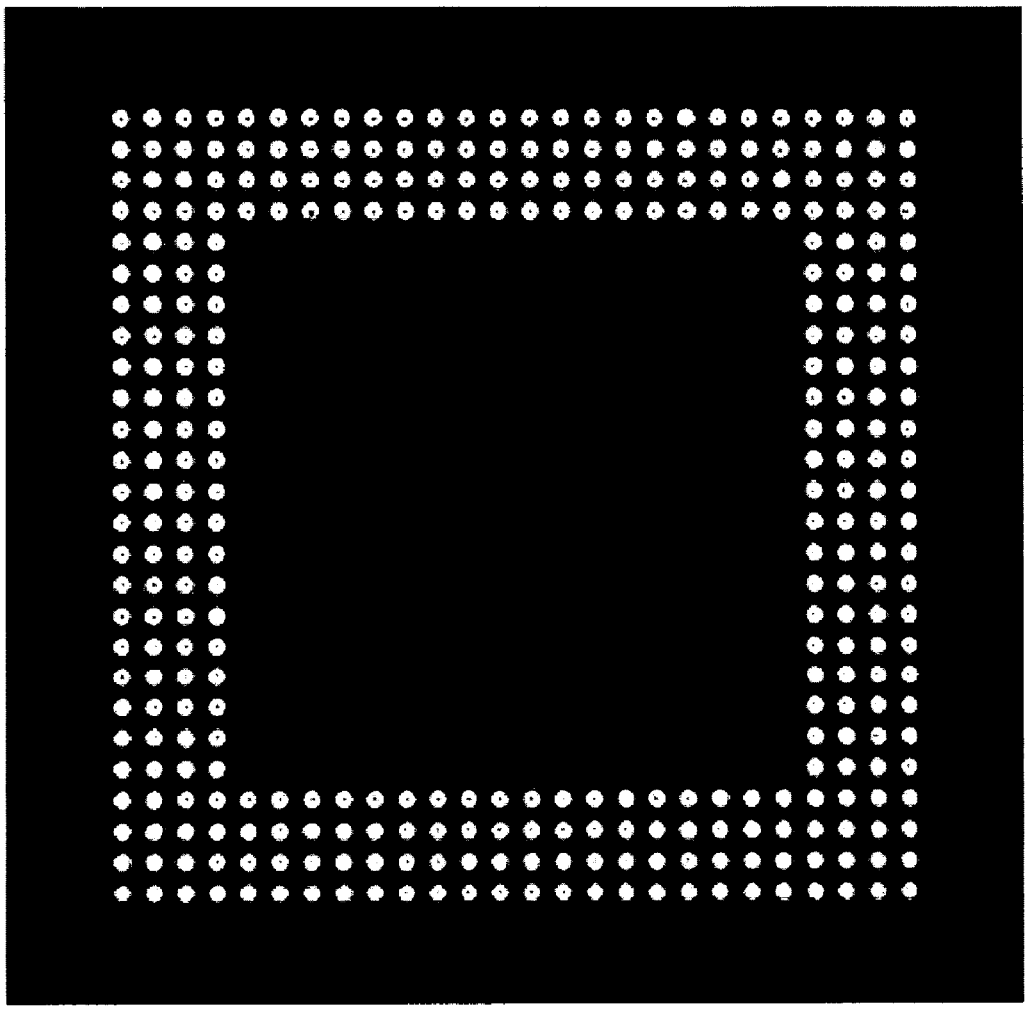
FIG. 10 shows an example of a multi-value image acquired by an imaging unit 208.
Figure 11A:
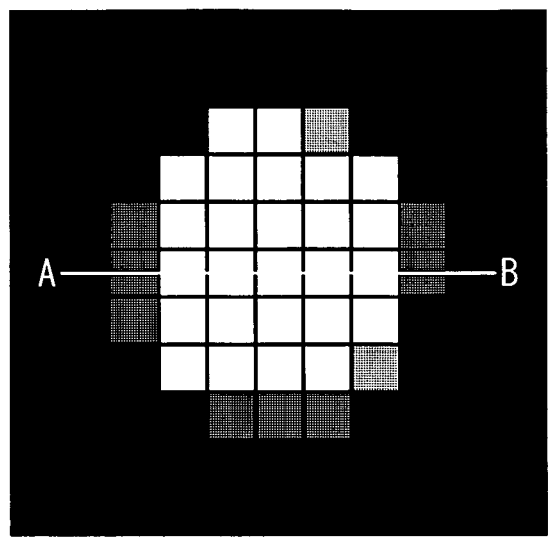
FIGS. 11A and 11B show an example of the pixel value distribution near the terminal 202 in regard to a multi-value image.
Figure 11B:
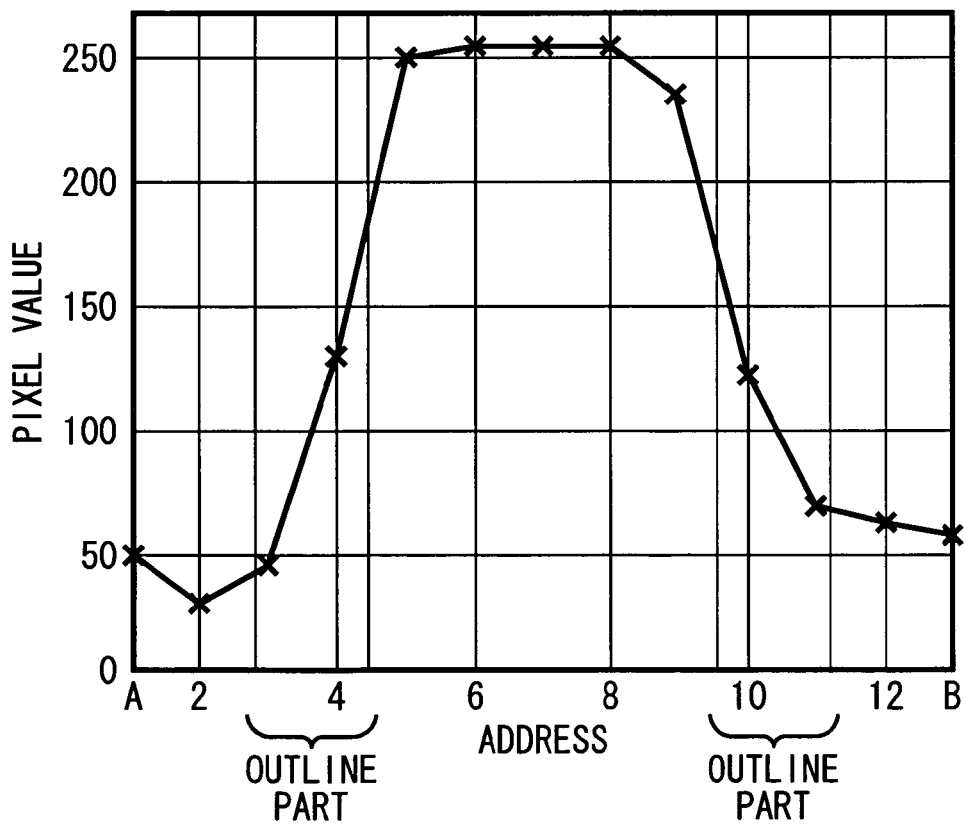
Figure 12:
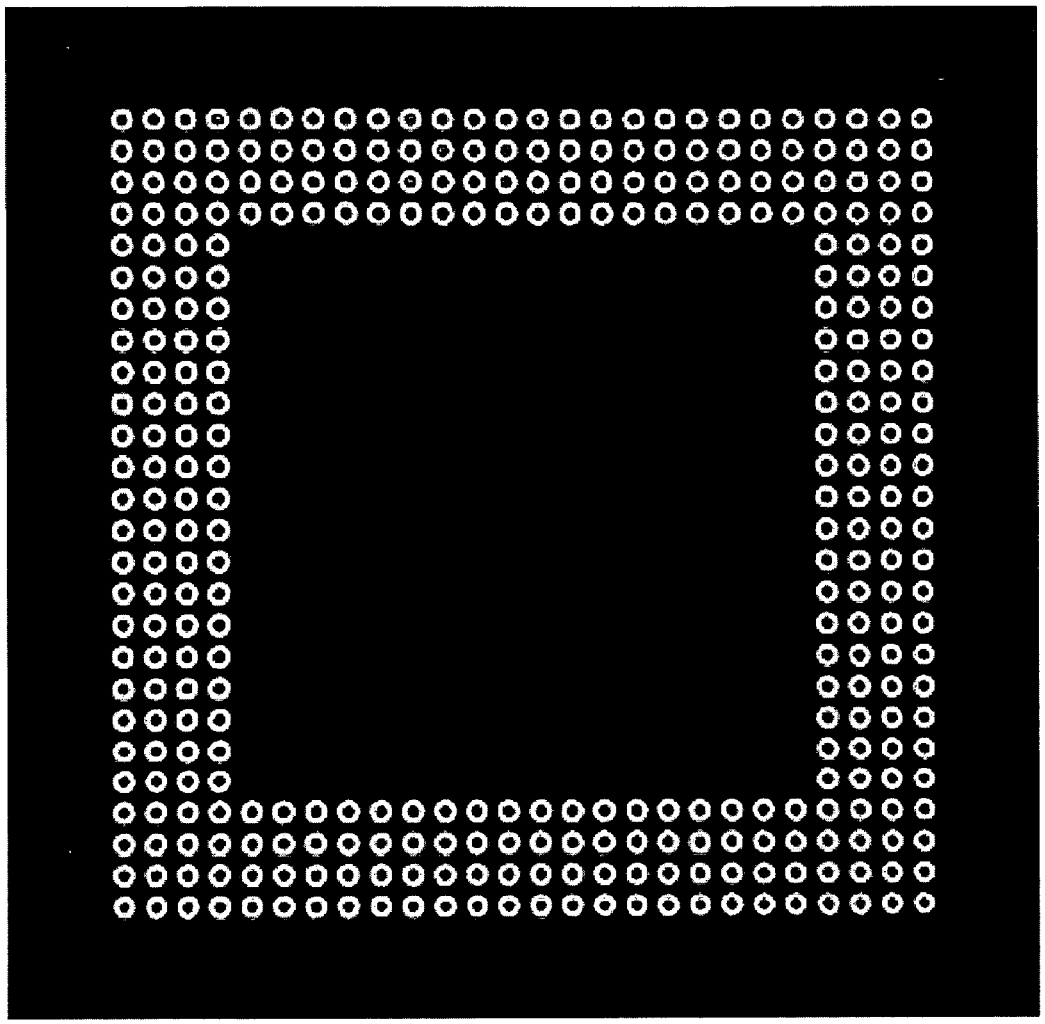
FIG. 12 shows an example of a differentiated image.
Figure 13:
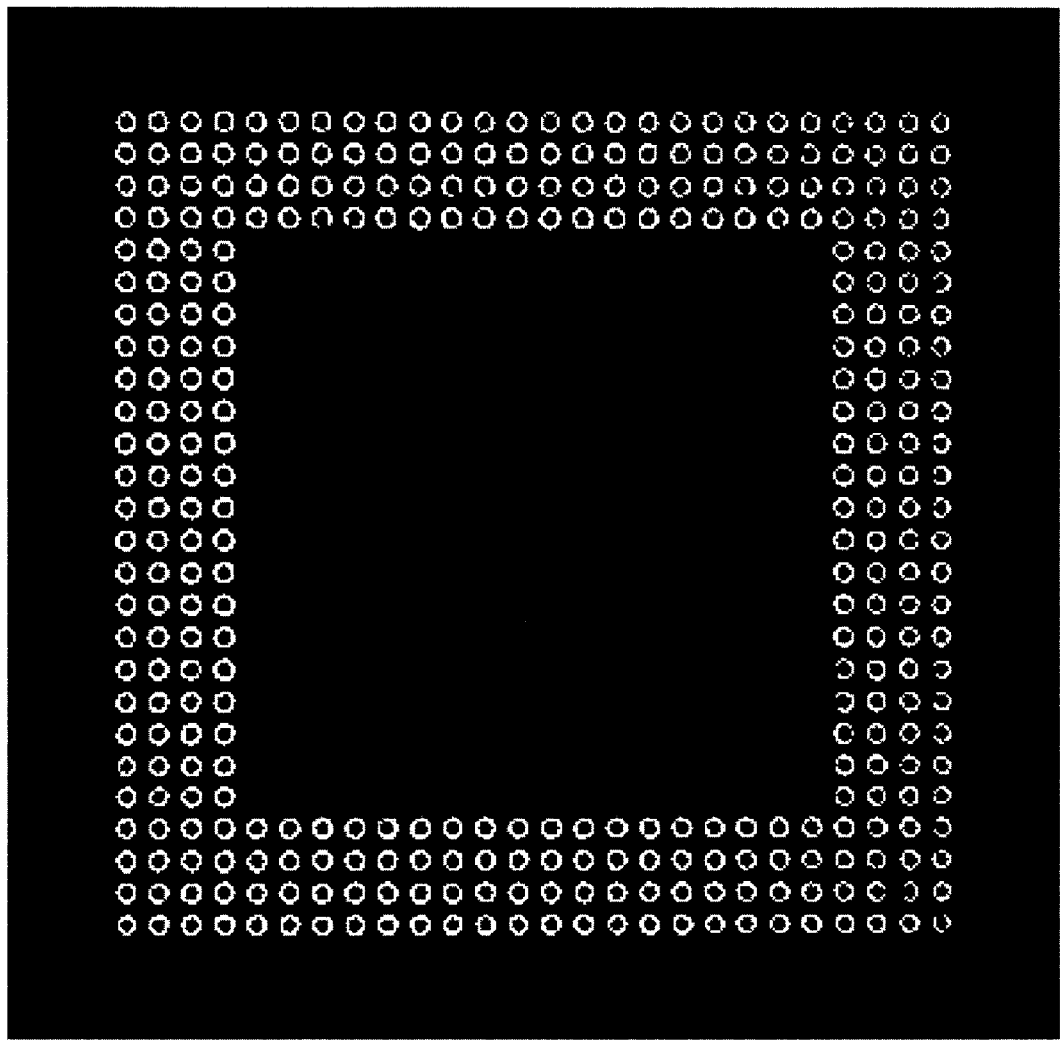
FIG. 13 shows an example of a binary value image indicating edge areas.
Figure 14:
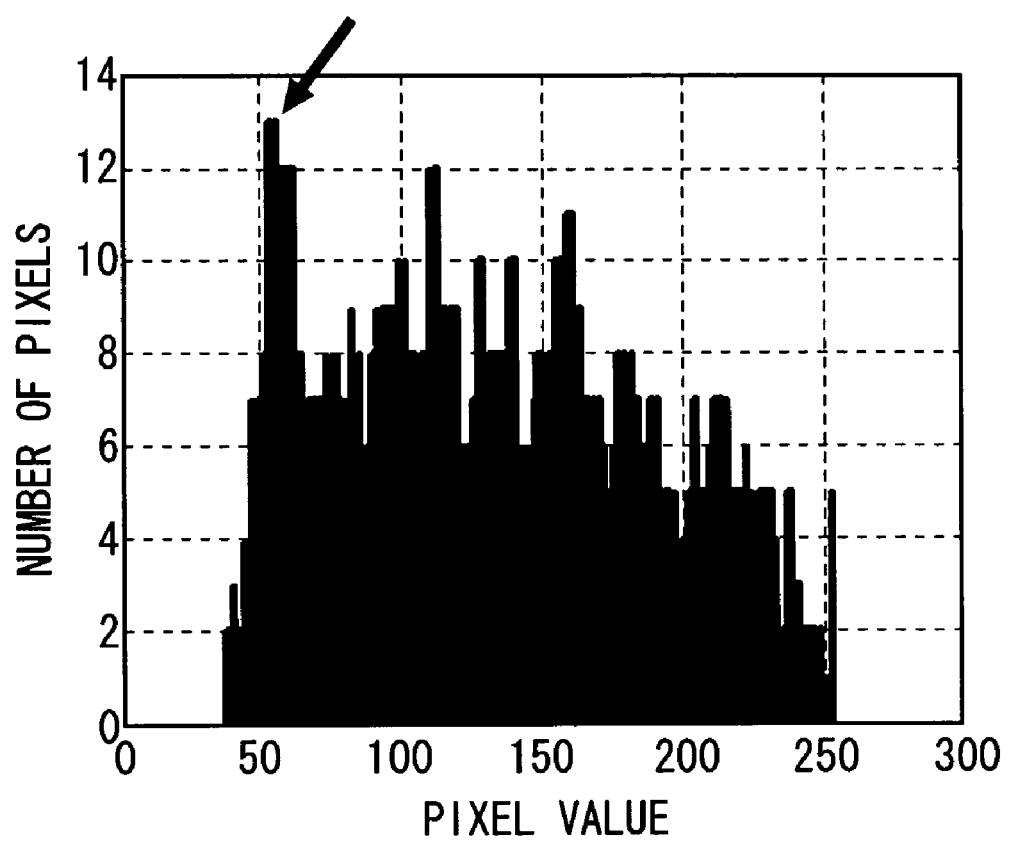
FIG. 14 shows an example of the histogram of pixel values of pixels of edge areas.
Figure 15:
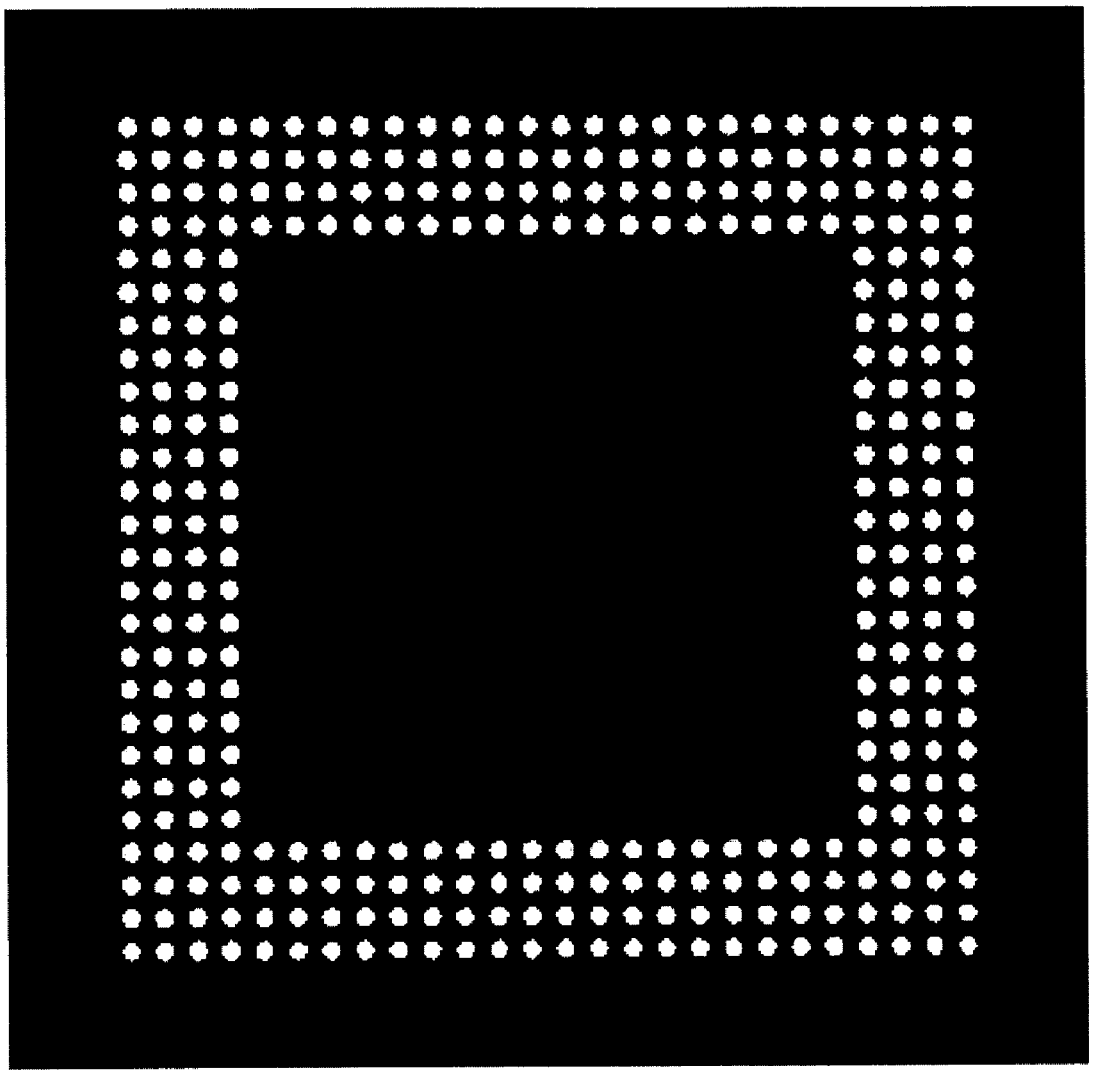
FIG. 15 shows an example of a binary value image indicating areas of terminals 202.

FIG. 9 is a flowchart showing an example of a method for detecting the position of the electronic component 204 by the electronic component carrying apparatus 200. FIG. 10 shows an example of the multi-value image acquired by the imaging unit 208. FIGS. 11A and 11B show an example of the pixel value distribution near the terminal 202 in regard to the multi-value image. FIG. 12 shows an example of the differentiated image. FIG. 13 shows an example of the binary value image indicating the edge areas. FIG. 14 shows an example of the histogram of pixel values of pixels of the edge areas. FIG. 15 shows an example of the binary value image indicating the areas of the terminals 202. Hereinafter, the method for detecting the position of the electronic component 204 will be described with reference to FIGS. 9 to 15.

First, the imaging unit 208 acquires the multi-value image shown in FIG. 10 of the plurality of terminals 202 of the electronic component 204 held by the carrying unit 205 (S100). As shown in FIG. 11A, the pixel value of the outline part of the terminal 202 is small, and as shown in FIG. 11B the pixel value in regard to the outline part of the terminal 202 is changed greatly.

Next, the differentiated image generating unit 230 generates the differentiated image shown in FIG. 12 from the multi-value image shown in FIG. 11 by a differentiating-type filter such as a Sobel filter (S102). And, the second threshold determining unit 232 adds the number of pixels in an order wherein the pixel value becomes large in regard to the differentiated image and determines the second threshold to be the pixel value when the number of pixels added reaches the edge expected value stored by the edge expected value storing unit 28 (S104). And, edge binary value image generating unit 234 generates the binary value image indicating the edge areas of the terminals 202 shown in FIG. 13 from the differentiated image shown in FIG. 12 based, on the second threshold determined by the second threshold determining unit 232 (S106).

Then, the edge area detecting unit 236 extracts the edge areas from the multi-value image shown in FIG. 10 by multiplying the pixel values of the pixels wherein the multi-value image shown in FIG. 10 and the binary value image shown in FIG. 13 (S108) correspond. And, the first threshold determining unit 222 obtains the histogram shown in FIG. 14 based on the pixel values of the pixels of the edge area extracted from the multi-value image shown in FIG. 10 (S110). And, the first threshold determining unit 222 determines the first threshold to be the pixel value wherein the number of pixels is greatest among the pixels of the edge area (S112). And, the terminal binary value image generating unit 224 generates the binary value image indicating the areas of the terminals 202 shown in FIG. 15 from the multi-value image shown in FIG. 10 based on the first threshold determined by the first threshold determining unit 222 (S114).

Next, the terminal area detecting unit 214 detects the areas of the plurality of terminals 202 based on the binary value image shown in FIG. 15 (S116). And, the terminal area detecting unit 214 calculates the dimension of the area of the terminal 202, i.e. the number of pixels of the area of the terminal 202 (S118). At this time, the terminal area detecting unit 214 may calculate the average of the numbers of pixels of the areas of the plurality of terminals 202. And, the first threshold determining unit 222 compares the number of pixels of the area of the terminal 202 detected by the terminal area detecting unit 214 with the terminal expected value stored in the terminal expected value storing unit 228 and judges whether the difference between them is more than a predetermined value (S120).

The first threshold determining unit 222 makes the first threshold smaller (S122) in case of judging that the number of pixels of the area of the terminal 202 detected by the terminal area detecting unit 214 in the step S120 is smaller than the terminal expected value by more than a predetermined value, and then the processes following the step S114 are repeated. And, the first threshold determining unit 222 makes the first threshold greater (S124) in case of judging that the number of pixels of the area of the terminal 202 detected by the terminal area detecting unit 214 in the step S120 is smaller than the terminal expected value by more than a predetermined value, and then the processes following the step S114 are repeated.

And, if the first threshold determining unit 222 judges that the number of pixels of the area of the terminal 202 detected by the terminal area detecting unit 214 in the step 120 is within a range of a predetermined value from the terminal expected value, then the terminal area detecting unit 214 detects the area of the terminal 202 based on the first threshold (S126), the electronic component position detecting unit 218 detects the position of the terminal 202 of the electronic component 204 based on the area of the terminal 202 detected by the terminal area detecting unit 214 and thus calculates the position of the electronic component 204 based on the position of the terminal 202 detected and the position at which the terminal 202 is formed in the electronic component 204, i.e. the terminal information of the electronic component 204 (S128).

FIGS. 16A and 16B show the strength distribution of the reflected light from the terminal 202 positioned closer to the light source 206 of the left side than the light source 206 of the right side. FIG. 16C shows an area 238 of the terminal 202 detected and center coordinates 240 calculated in case of setting the first threshold to be $V_1$ shown in FIG. 16B. In addition, FIGS. 16D and 16E show the strength distribution of the reflected light from the terminal 202 positioned closer to the light source 206 of the right side than the light source 206 of the left side. FIG. 16F shows an area 238 of the terminal 202 detected by using the threshold process and center coordinates 240 calculated in case of setting the first threshold to be $V_1$ shown in FIG. 16E.

As shown in FIGS. 16A and 16D, even though the center of the strength distribution of the reflected light from the front surface of the terminal 202 does not match the center of the terminal 202, it is possible to detect the area of the terminal 202 accurately as shown in FIGS. 16C and 16F by setting the first threshold to be $V_1$.

According to the electronic component carrying apparatus 200 of the present embodiment, it is possible to determine the first threshold for extracting the areas of the terminals 202 from the multi-value image acquired by the imaging unit 208 rapidly and properly. In addition, by repeating the adjustment of the first threshold by comparing the pixel values and the terminal expected value of the area of the terminal 202 detected, it is possible to determine the first threshold more properly. In addition, even though the brightness is decreased or the brightness distribution becomes uneven because of using the light source 206 for a ling time, it is possible to correct the first threshold promptly. Therefore, since it is possible to calculate the center coordinates of the terminal 202 accurately, it is possible to detect the position of the electronic component 204 accurately.

Figure 18A:
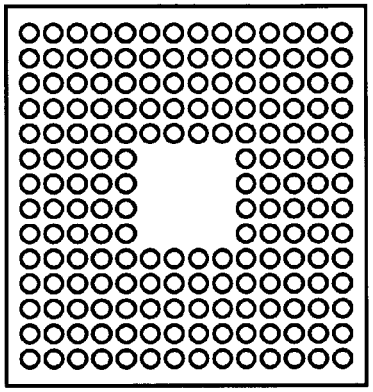
FIGS. 18A and 18B show an example of a display screen of a display device 242.
Figure 19:
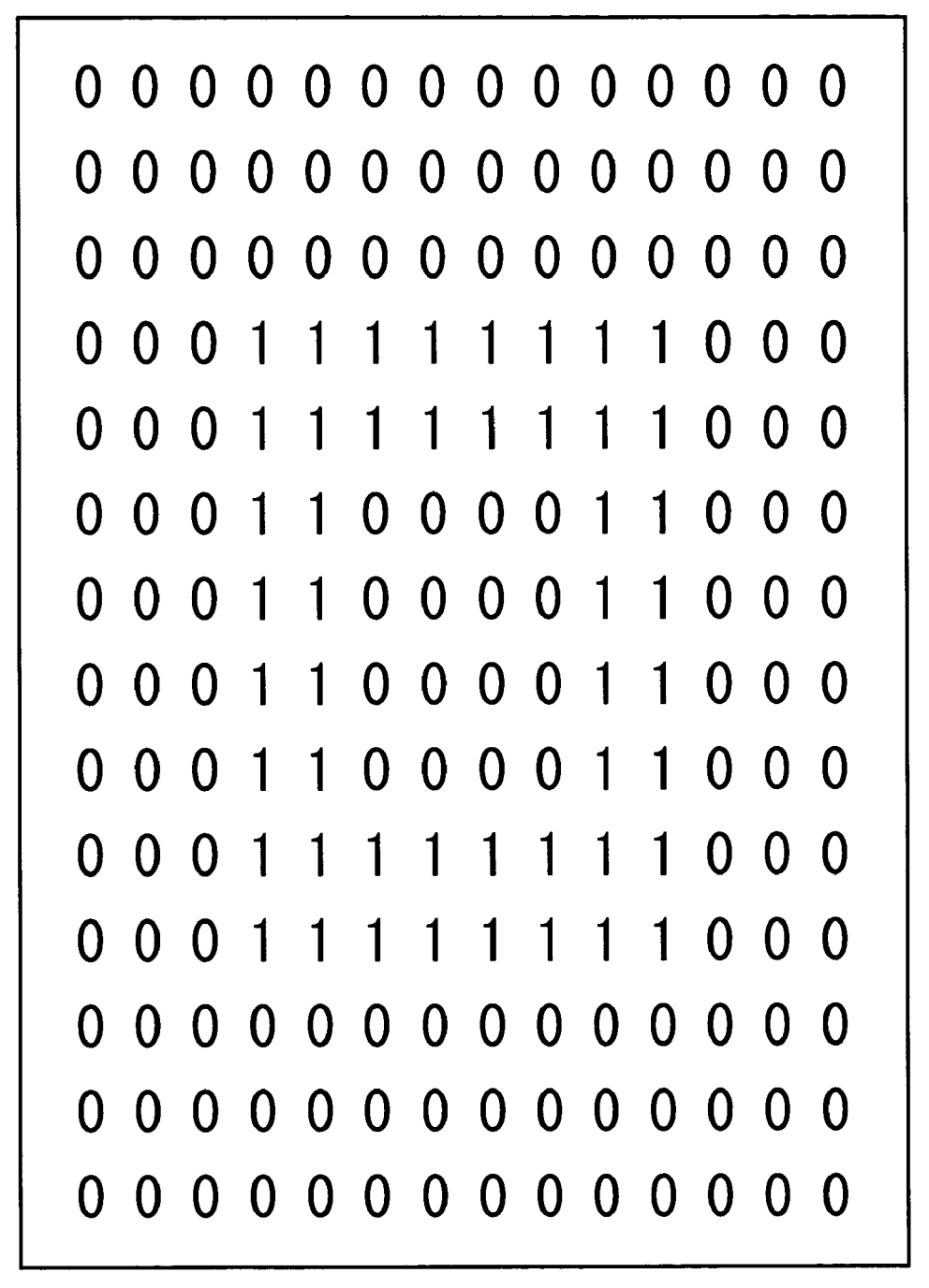
Figure 20A:
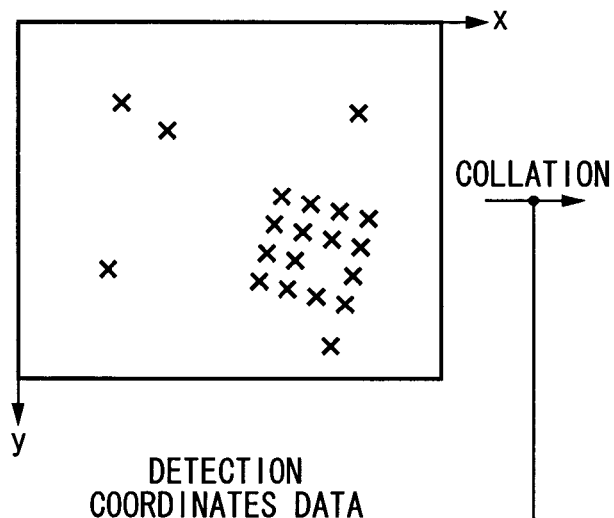
FIGS. 20A through 20C show a process of collating detection coordinates data and ideal coordinates data.
Figure 20C:
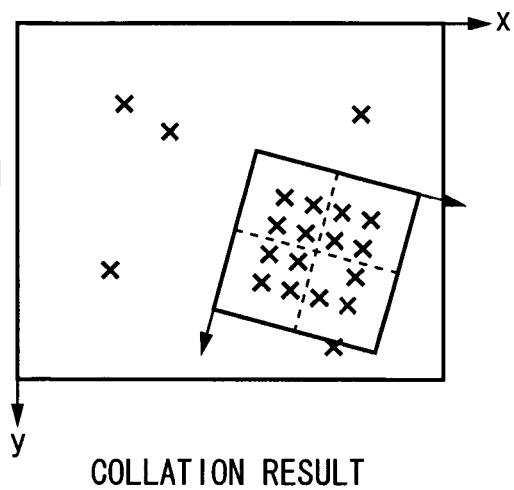
Figure 20B:
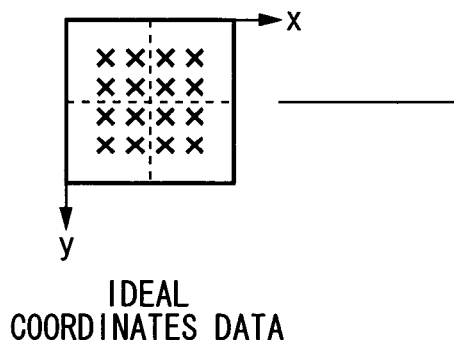
Figures 21A, 21B:
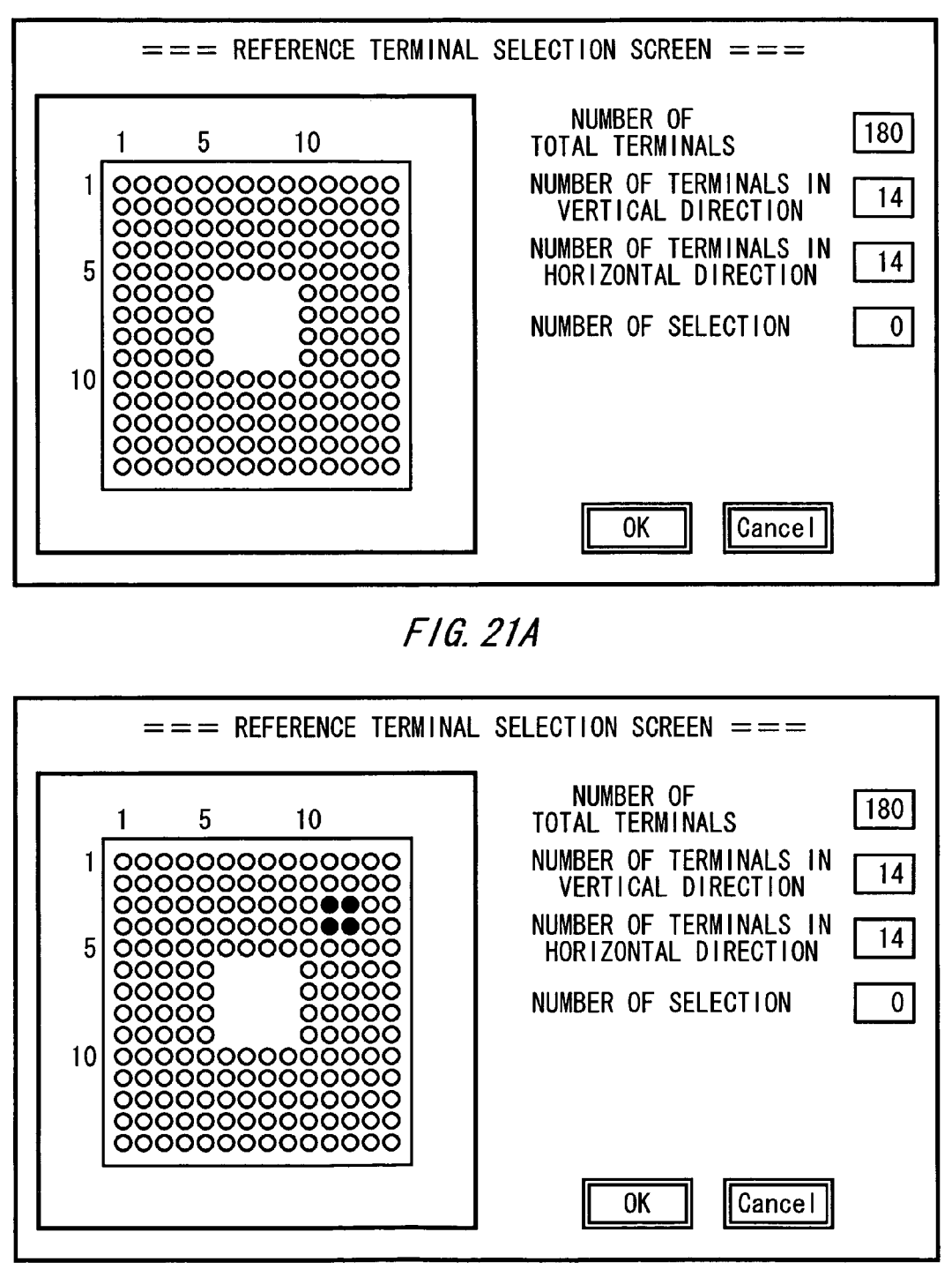
Figure 22:
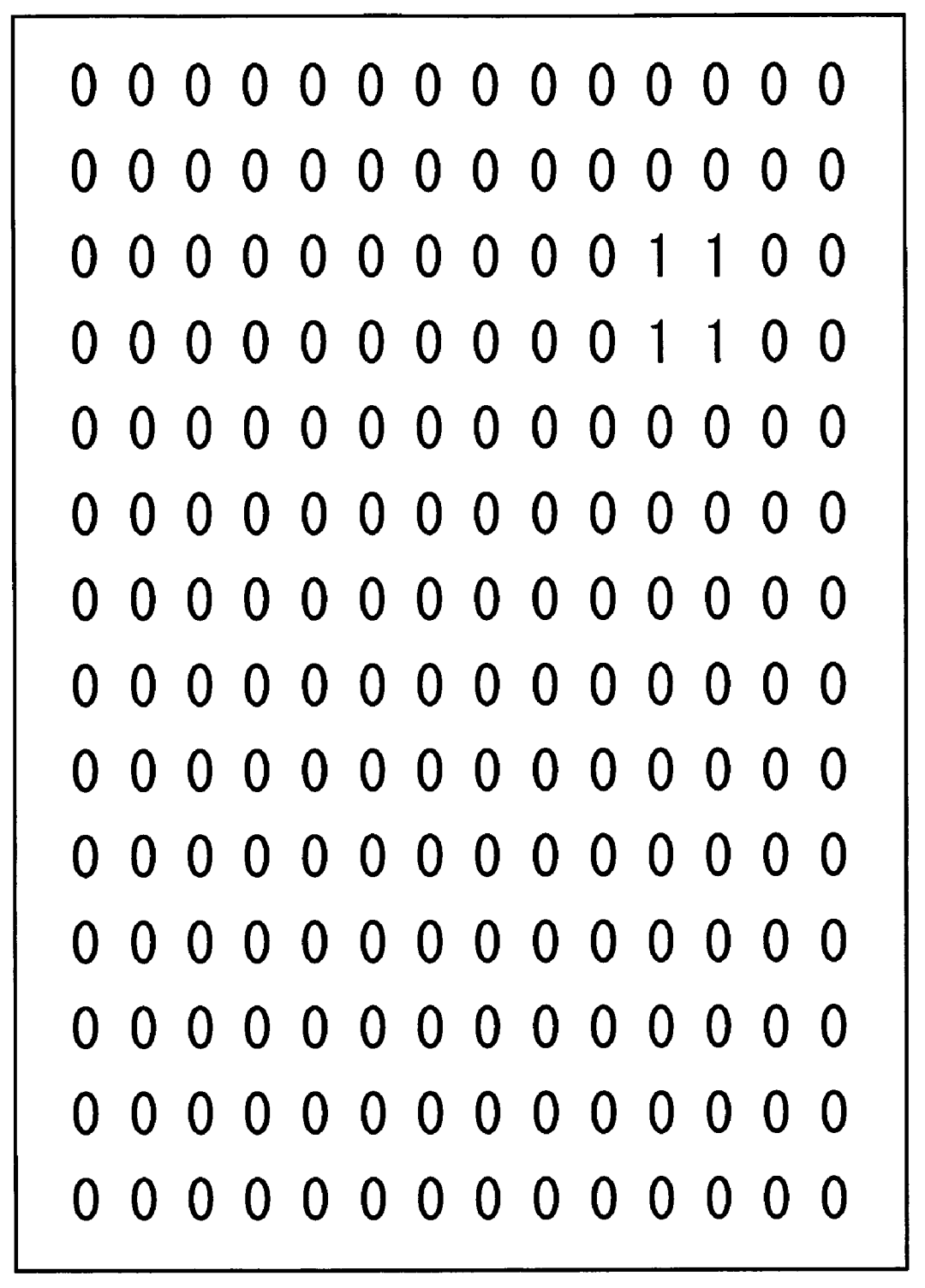

FIG. 17 shows an example of the configuration of the electronic component position detecting unit 218. FIG. 18A shows an example of a display screen of a display device 242. FIG. 19 shows an example of terminal to be detected arrangement data. FIGS. 20A to 20C show a process of collating detection coordinates data and ideal coordinates data. FIGS. 21A and 21B show an example of a display screen of the display device 242. FIG. 22 shows an example of reference terminal arrangement data.

The electronic component carrying apparatus 200 includes a display device 242 for displaying arrangement information of the terminals 202 to a user and an input device 244 by which design data or specifications of the terminals 202, i.e. an example of predetermined terminal information of the electronic component 204, and the electronic component position detecting unit 218 includes a detection information setting unit 246 for setting the arrangement information of the terminal to be detected, i.e. the terminal 202 that is a reference for positioning the electronic component 204, an ideal coordinates calculating unit 248 for calculating the ideal coordinates data of the terminal to be detected based on the arrangement information of the terminal to be detected, a detection coordinates collating unit 250 for detecting the position of the electronic component 204 by collating the detection coordinates data calculated by the terminal area detecting unit 214 and the ideal coordinates data calculated by the ideal coordinates calculating unit 248 and a detected position correcting unit 252 for correcting the position of an electronic component detected by the detection coordinates collating unit 250.

Figure 18B:
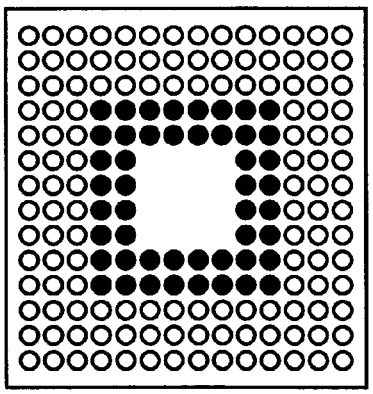

The detection information setting unit 246 prepares the arrangement information of the terminals 202 based on the design data of the terminals 202 of the electronic component 204. The design data includes the number of the terminals, the size of the terminals, the distance between the terminals and the like. And, the display device 242 displays a terminal to be detected selection screen including the arrangement information prepared by the detection information setting unit 246 as shown in FIG. 18A. The display device 242, e.g. a GUI (Graphical User Interface), allows a user to select the terminal to be detected. In addition, the input device 244 is, e.g. a keyboard, mouse or the like, and the terminal to be detected may be selected by using the input device 244. In addition, the display device 242 displays the arrangement information indicating the terminals to be detected, which are selected, as shown in FIG. 18B. And, the detection information setting unit 246 generates the terminal to be detected arrangement data as shown in FIG. 19 based on the selection result of the terminal to be detected. The terminal to be detected arrangement data may be bitmap data that represents the terminal to be detected by "1" and the terminal not to be detected by "0".

The ideal coordinates calculating unit 248 calculates the ideal coordinates data of the terminal to be detected in regard to the electronic component 204 based on the design data of the terminal 202 of the electronic component 204, imaging condition data of the imaging unit 208 and the terminal to be detected arrangement data. The imaging condition data includes the magnification and resolution of a lens. Further, the terminal to be detected arrangement data, the ideal coordinates data, and the like required in advance, may be stored in a recording medium such as a hard disk drive. In addition, in case of detecting the position of the electronic component 204 continuously, the terminal to be detected arrangement data, the ideal coordinates data, and the like required in advance, may be stored in a recording medium such as a RAM.

The detection coordinates collating unit 250, as shown in FIG. 20C, collates the detection coordinates data calculated by the terminal area detecting unit 214 as shown in FIG. 20A and the ideal coordinates data calculated by the ideal coordinates calculating unit 248 as shown in FIG. 20B. The detection coordinates collating unit 250 collates the ideal coordinates data and the detection coordinates data using affine transformation and detects the position (xc, yc), at which the degree of coincidence between the ideal coordinates data and the detection coordinates data is greatest, and the rotation angle θc of the ideal coordinates data against the detection coordinates data as the position of the electronic component 202. In evaluating the degree of coincidence between the ideal coordinates data and the detection coordinates data, the sum of the distances between pieces of the corresponding coordinates data or the mean-square error of them can be used. Further, if the degree of coincidence between the ideal coordinates data and the detection coordinates data is less than a predetermined target value, the imaging unit 208 may acquire the multi-value image and the terminal area detecting unit 214 may calculate the detection coordinates data once again.

Further, the display device 242 displays the reference terminal selection screen including the arrangement information prepared by the detection information setting unit 246 as shown in FIG. 21A. And, the display device 242 or the input device 244 allows a user to select the reference terminal. And, the display device 242 displays the arrangement information indicating the reference terminal selected as shown in FIG. 21B. And, the detection information setting unit 246 generates the reference terminal arrangement data as shown in FIG. 22 based on the selection result of the reference terminal by the user. The reference terminal arrangement data may be bitmap data that represents the reference terminal by "1" and the non-reference terminal by "0".

The detected position correcting unit 248 calculates the ideal coordinates data of the reference terminal in regard to the electronic component 204 based on the design data of the terminal 202 of the electronic component 204, the imaging condition data of the imaging unit 208 and the reference terminal arrangement data. And, the carrying unit 208 corrects the position of the electronic component 204 based on the position (xc, yc) and the rotation angle θc of the electronic component 204 detected by the detection coordinates collating unit 250. And, the imaging unit 208 acquires the multi-value image of the electronic component 204 in which the position is corrected, and the terminal area detecting unit 214 calculates the detection coordinates data based on the multi-value image acquired by the imaging unit 208.

The detection coordinates collating unit 250 collates the detection coordinates data calculated by the terminal area detecting unit 214 after the position of the electronic component 204 has been corrected and the ideal coordinates data calculated by the detected position correcting unit 248 and calculates an error ($\delta_x$, $\delta_y$) of the positions of the ideal coordinates data and the detection coordinates data in regard to the reference terminal and an error $\delta_\theta$ of the rotation angle. And, the detection coordinates collating unit 250 corrects the position (xc, yc) and the rotation angle θc of the electronic component 204 into (xc−$\delta_x$, yc−$\delta_y$) and the rotation angle θc−$\delta_\theta$ and sets the error in regard to the reference terminal to be minimum. If a plurality of reference terminals are selected, the mean-square of the error corresponding to each of the plurality of reference terminals may be corrected as ($\delta_x$, $\delta_y$) and $\delta_\theta$.

According to the electronic component carrying apparatus 200 of the present invention, since it is possible to select a small number of the terminals 202 as the terminal to be detected in order to perform the collation process, it is possible to detect the position of the electronic component 204 rapidly regardless of the electronic component 204 having a large number of the terminals 202.

Figure 23:
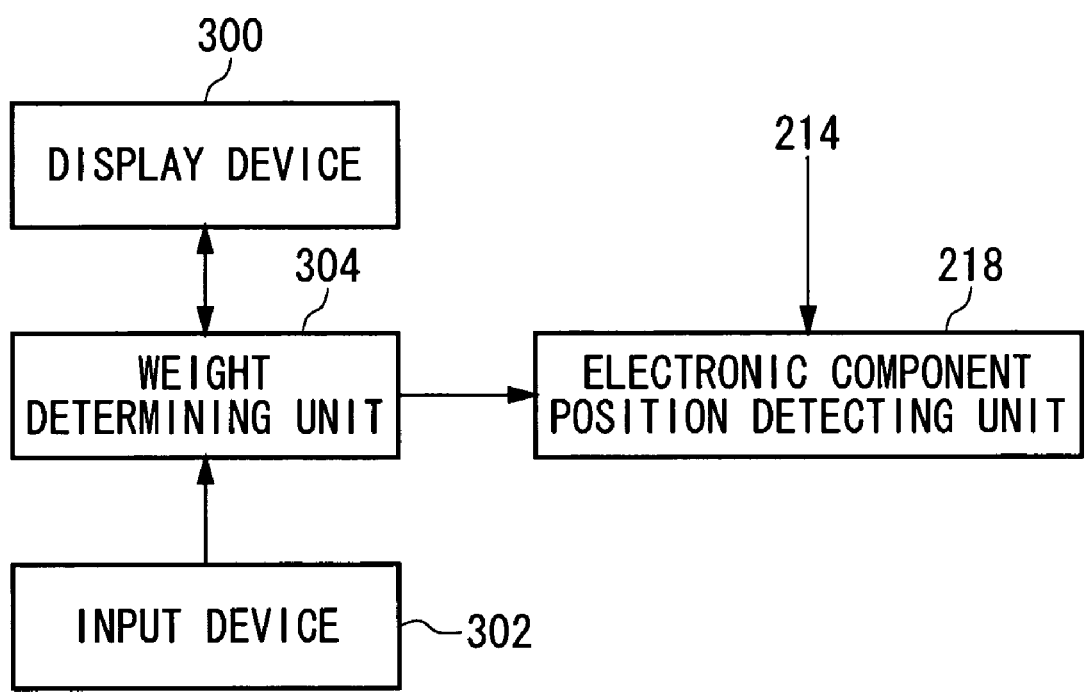
FIG. 23 shows another example of the configuration of an electronic component carrying apparatus 200.

FIG. 23 shows another example of the configuration of an electronic component carrying apparatus 200. FIG. 24 shows an example of a display screen of a display device 300. The electronic component carrying apparatus 200 includes a display device 300 for displaying the arrangement information indicating the arrangement of a plurality of terminals 202 of the electronic component 204 an input device 302 for allowing a user to select any of the plurality of terminals 202 displayed by the display device 300 and a weight determining unit 304 for determining the weight of the position of the plurality of terminals 202 based on the selection of the user. Further, the electronic component position detecting unit 218 shown in FIG. 23 has the same configurations and functions as those of the electronic component position detecting unit 218 shown in FIGS. 7 to 22.

Figures 24A, 24B:
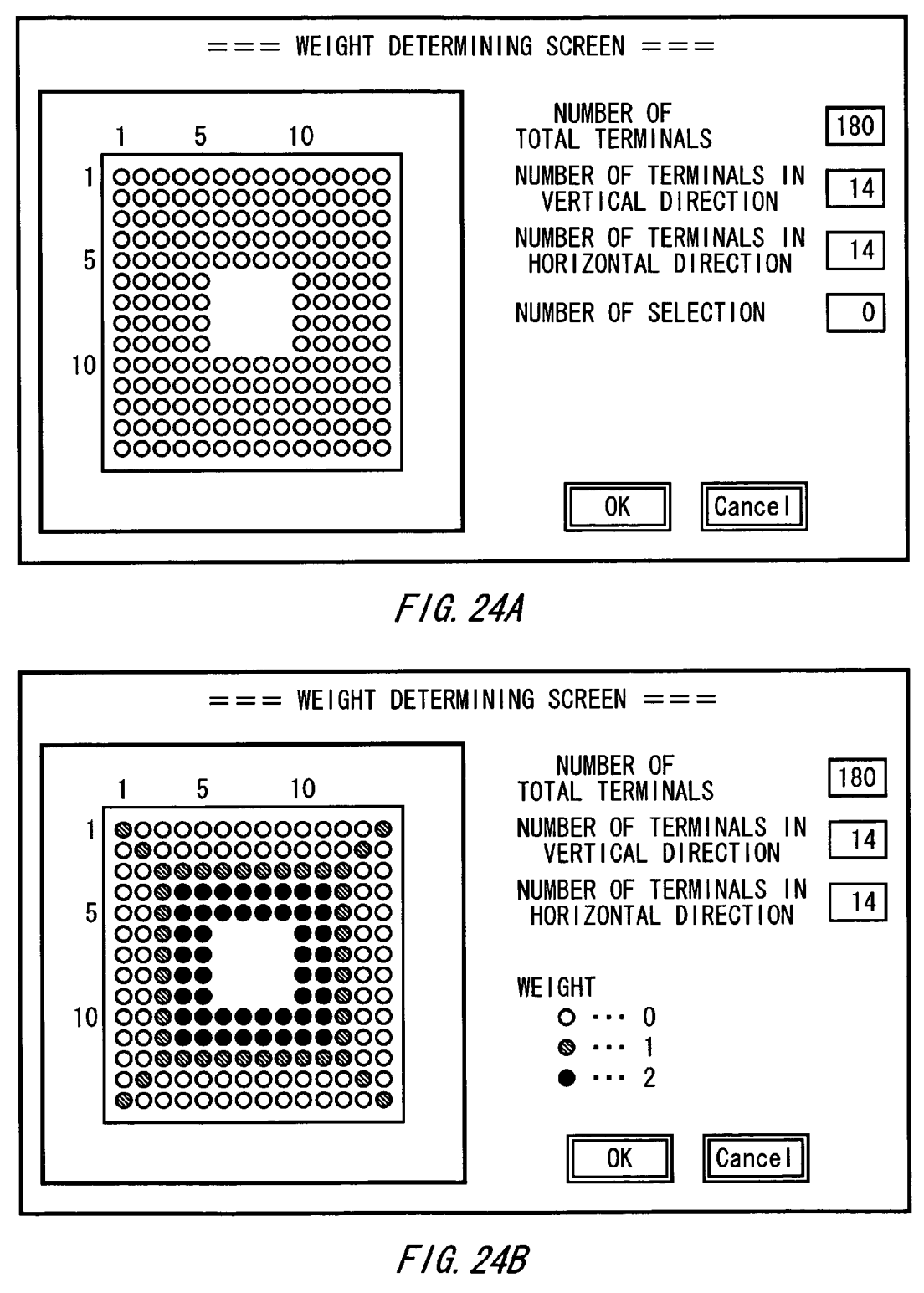

The display device 300, e.g. a GUI (Graphical User Interface), displays a weighting determination screen including the arrangement information of the terminal 202 prepared based on the design data of the terminal 202 of the electronic component 204 as shown in FIG. 24A. In addition, the input device 302, e.g. a keyboard, mouse or the like, allows a user to select at least one of the terminals 202 displayed by the display device 300. And, the weight determining unit 304 determines the weight of the position of at least one of the terminals 202 selected by the user through the input device 302 to be greater than other terminals 202. In addition, the input device 302 may allow the user to select at least one of the terminals 202 displayed by the display device 300 for each magnitude of the weight of the position of the terminal 202. And, the weight determining unit 304 determines the weight of the position of at least one of the terminals 202 selected by the user through the input device 302 for each magnitude of the weight of the position of the terminal 202 as the weight of each of the terminals 202.

In addition, the weight determining unit 304 may set the weight of the position of the terminal 202 performing input or output of analog signals among the plurality of terminals, automatically, to be greater than the weight of the position of the terminal 202 performing input or output of other signals of the analog signals, based on the design data or specification of the electronic component 204. Therefore, the terminal 202 performing input or output of analog signals can be positioned to the socket 203 with high precision, so that the noise in regard to the analog signals can be reduced, and thus it is possible to test the performance of the electronic component 204 in relation to the input or output of the analog signals accurately.

In addition, the weight determining unit 304 may determine the weight of the position of the plurality of terminals 202 based on the frequency of the signals the plurality of terminals 202 have to input or output based on the design data or specification of the electronic component 204. For example, the input device 302 inputs the frequency determined by a user as the threshold in advance. And, the weight determining unit 304 may set the weight of the position of the terminal 202 performing input or output of signals, of which the frequency is greater than a predetermined frequency, among the plurality of terminals 202 to be greater than the weight of the position of the terminal 202 performing input or output of signals, of which the frequency is smaller than the predetermined frequency.

In addition, the weight determining unit 304 may set the weight of the position of the terminal 202 performing input or output of signals of a greater frequency to be greater than the weight of the position of the terminal 202 performing input or output of signals of a smaller frequency. For example, the weight determining unit 304 may set the weight of the position of each of the plurality of terminals 202 to be a value in proportion to the frequency of the signals that each of the plurality of terminals 202 inputs or outputs.

In addition, as another example, the weight determining unit 304 may set the weight of the position of the terminal 202 performing input or output of clock signals among the plurality of terminals 202 to be greater than the weight of the position of the terminal 202 performing input or output of other signals of the clock signals.

And, when the weights of the positions of the plurality of terminals 202 are determined by the weight determining unit 304, the display device 300 displays each of the terminals 202 selected by the user for each of the positions of the terminals 202 or each of the terminals 202 determined automatically together with the image indicating the weight of the position of the terminal 202. For example, the display device 300, as shown in FIG. 24B, may display the terminals 202 of which the colors are separated for each weight of the position of the terminal 202, and display each of the terminals 202 along with a value of the weight.

And, the electronic component position detecting unit 214 detects the position of the electronic component 204 based on the weight of the position of each the terminal 202 selected for each weight of the position of the terminal 202 determined by the weight determining unit 304 or the weight of the position of each terminal 202 determined automatically. Therefore, since it is possible to detect the position of the electronic component 204 while setting the important weight of the terminal 202 affecting the performance of the electronic component 204 significantly to be large by the selection of a user or automatically, it is possible to position of the important terminal 202, which affects the performance of the electronic component 204 significantly, to the socket 203 with high precision. Therefore, it is possible to test the performance of the electronic component 204 accurately.

As obvious from the description above, according to the present invention, it is possible to provide the position detecting apparatus, the position detecting method, and the electronic component carrying apparatus capable of detecting the position of an electronic component accurately.

Although the present invention has been described by way of exemplary embodiments, it should be understood that those skilled in the art might make many changes and substitutions without departing from the spirit and the scope of the present invention which is defined only by the appended claims.

What is claimed is:

1. A position detecting apparatus for detecting a position of an electronic component, which comprises a terminal, comprising:

an image acquiring unit for acquiring an image of said terminal;

a terminal area detecting unit for detecting an area of said terminal from said image acquired by said image acquiring unit;

an electronic component position detecting unit for detecting a position of said electronic component based on said area of said terminal detected by said terminal area detecting unit and predetermined terminal information of said electronic component;

an edge extracting unit for extracting an edge area, which is an area of an edge of said terminal, from a multi-value image which is said image acquired by said image acquiring unit; and a first threshold determining unit for determining a first threshold to be a pixel value at which a number of pixels is greatest among pixels of said edge area, wherein said terminal area detecting unit detects said area of said terminal from said multi-value image based on said first threshold, and wherein said edge extracting unit further comprises;

an edge expected value storing unit for storing an edge expected value which is an expected value of the number of pixels of said edge area;

a differentiated image generating unit for generating a differentiated image resulting from differentiating said multi-value image;

a second threshold determining unit for adding the number of pixels in an order wherein the pixel value becomes greater in regard to said differentiated image and determining a second threshold to be the pixel value when said number of pixels added reaches said edge expected value; and an edge area detecting unit for detecting said edge area from said multi-value image based on said second threshold.

2. The position detecting apparatus as claimed in claim 1, wherein said electronic component position detecting unit detects the position of said terminal based on said area of said terminal detected by said terminal area detecting unit and calculates said position of said electronic component based on said position of said terminal detected and the position, which is said terminal information and said terminal is formed at in regard to said electronic component.

3. The position detecting apparatus as claimed in claim 1 further comprising a light source for emitting light onto said terminal in a slanting direction to said electronic component,
wherein said image acquiring unit detects said multi-value image of said terminal onto which light is emitted by said light source.

4. The position detecting apparatus as claimed in claim 1, wherein said image acquiring unit detects said multi-value image of a plurality of said terminals of said electronic component,
said edge extracting unit extracts a plurality of said edge areas of said plurality of terminals from said multi-value image,
said first threshold determining unit determines said first threshold to be the pixel value at which the number of pixels is greatest among pixels of said plurality of edge areas,
said terminal area determining unit detects areas of said plurality of terminals from said multi-value image based on said first threshold and said electronic component position detecting unit detects said position of said electronic component based on said areas of said plurality of terminals.

5. The position detecting apparatus as claimed in claim 1, wherein said electronic component comprises said terminal having a substantially spherical surface, and
said image acquiring unit acquires said multi-value image of said terminal having said substantially spherical surface onto which light is emitted by said light source.

6. The position detecting apparatus as claimed in claim 1, further comprising a terminal binary value image generating unit for generating a binary value image from said multi-value image based on said first threshold,
wherein said terminal area detecting unit detects said area of said terminal from said multi-value image based on said binary value image generated by said terminal binary value image generating unit.

7. The position detecting apparatus as claimed in claim 1, wherein said edge extracting unit further comprises an edge binary value image generating unit for generating a binary value image from said differentiated image based on said second threshold, and
said edge area detecting unit detects said edge area from said multi-value image by multiplying the pixel value of a pixel wherein said binary value image generated by said edge binary value image generating unit and said multi-value image correspond.

8. The position detecting apparatus as claimed in claim 1, further comprising a terminal expected value storing unit for storing a terminal expected value, which is an expected value of the number of pixels of said area of said terminal,
wherein said first threshold determining unit changes said first threshold in case said number of pixels of said area of said terminal detected by said terminal area detecting unit is different from said terminal expected value by more than a predetermined value.

9. The position detecting apparatus as claimed in claim 1 further comprising:
a display device for displaying an arrangement of a plurality of said terminals of said electronic component;
an input device for allowing a user to select at least one of said plurality of terminals displayed by said display device; and
a weight determining unit for setting a weight of a position of said at least one, which is selected by said user with said input device, of said plurality of terminals to be greater than the weight of the position of said terminal not selected by said user,
wherein said electronic component position detecting unit detects said position of said electronic component based on said weight of each position of said terminal determined by said weight determining unit.

10. The position detecting apparatus as claimed in claim 9, wherein said input device allows said user to select at least one of said plurality of terminals displayed by said display device for each magnitude of said weight of said position of said terminal, and
said electronic component detecting unit detects said position of said electronic component based on said weight of each position of said terminal selected for each weight of said position of said terminal.

11. The position detecting apparatus as claimed in claim 10, wherein said display device displays each terminal selected for each weight of said position of said terminal together with an image indicating said weight of said position of said terminal.

12. The position detecting apparatus as claimed in claim 9, wherein said weight determining unit sets the weight of the position of a terminal performing input or output of a first analog signal among said plurality of terminals to be greater than a weight of a position of a terminal performing input or output of a second analog signal.

13. The position detecting apparatus as claimed in claim 9, wherein said weight determining unit determines weights of positions of said plurality of terminals based on a frequency of a signal which is supposed to be inputted or outputted through said plurality of terminals.

14. The position detecting apparatus as claimed in claim 9, wherein said weight determining unit sets a weight of a position of a terminal performing input or output of a signal of a first frequency greater than a predetermined frequency among said plurality of terminals to be greater than the weight of the position of a terminal performing input or output of a signal of a second frequency smaller than a predetermined frequency.

15. A position detecting method for detecting a position of an electronic component, which comprises a terminal, comprising the steps of:
acquiring a multi-value image of said terminal;
detecting an area of said terminal from said multi-value image acquired; and
detecting said position of said electronic component based on said area of said terminal detected;
extracting an edge area, which is an area of an edge of said terminal, from said multi- value image acquired; and
determining a first threshold to be a pixel value at which a number of pixels is greatest among pixels of said edge area, wherein said detecting an area of said terminal is based on said first threshold, and wherein said extracting an edge area further comprises:

storing an edge expected value which is an expected value of the number of pixels of said edge area;

generating a differentiated image resulting from differentiating said multi-value image;

adding the number of pixels in an order wherein the pixel value becomes greater in regard to said differentiated image and determining a second threshold to be the pixel value when said number of pixels added reaches said edge expected value; and detecting said edge area from said multi-value image based on said second threshold.

16. An electronic component carrying apparatus for carrying an electronic component, which comprises a terminal, to a desired position, comprising:

a carrying unit for holding and carrying said electronic component;

an image acquiring unit for acquiring an image of said terminal of said electronic component held by said carrying unit;

a terminal area detecting unit for detecting an area of said terminal from said image acquired by said image acquiring unit; and an electronic component position detecting unit for detecting a position of said electronic component corresponding to said carrying unit based on said area of said terminal detected by said terminal area detecting unit;

an edge extracting unit for extracting an edge area, which is an area of an edge of said terminal, from a multi-value image which is said image acquired by said image acquiring unit; and a first threshold determining unit for determining a first threshold to be a pixel value at which a number of pixels is greatest among pixels of said edge area.

wherein said terminal area detecting unit detects said area of said terminal from said multi-value image based on said first threshold, and wherein said edge extracting unit further comprises:

an edge expected value storing unit for storing an edge expected value which is an expected value of the number of pixels of said edge area;

a differentiated image generating unit for generating a differentiated image resulting from differentiating said multi-value image;

a second threshold determining unit for adding the number of pixels in an order wherein the pixel value becomes greater in regard to said differentiated image and determining a second threshold to be the pixel value when said number of pixels added reaches said edge expected value; and an edge area detecting unit for detecting said edge area from said multi-value image based on said second threshold.

* * * * *